US009576969B2

(12) United States Patent
Manorotkul et al.

(10) Patent No.: US 9,576,969 B2
(45) Date of Patent: Feb. 21, 2017

(54) INTEGRATED CIRCUIT DEVICE INCLUDING POLYCRYSTALLINE SEMICONDUCTOR FILM AND METHOD OF MANUFACTURING THE SAME

(71) Applicant: Samsung Electronics Co., Ltd., Suwon-si (KR)

(72) Inventors: Wanit Manorotkul, Hwaseong-si (KR); Joong-han Shin, Yongin-si (KR); Bong-jin Kuh, Suwon-si (KR); Han-mei Choi, Seoul (KR); Dmitry Mikulik, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/185,020

(22) Filed: Jun. 17, 2016

(65) Prior Publication Data

US 2016/0300847 A1    Oct. 13, 2016

Related U.S. Application Data

(62) Division of application No. 14/804,338, filed on Jul. 21, 2015, now Pat. No. 9,391,090.

(30) Foreign Application Priority Data

Aug. 21, 2014    (KR) .......................... 10-2014-0109041

(51) Int. Cl.
*H01L 27/115* (2006.01)
*H01L 21/02* (2006.01)
(Continued)

(52) U.S. Cl.
CPC ... *H01L 27/11575* (2013.01); *H01L 21/02532* (2013.01); *H01L 21/02592* (2013.01);
(Continued)

(58) Field of Classification Search
CPC ............. H01L 23/528; H01L 21/32055; H01L 27/11575; H01L 21/02592; H01L 27/11573; H01L 27/11565; H01L 27/11548; H01L 21/02675; H01L 27/11582; H01L 27/11556; H01L 21/02532

See application file for complete search history.

(56) References Cited

U.S. PATENT DOCUMENTS 6,429,484 B1 * 8/2002 Yu ....................... H01L 21/8221
257/347
7,179,694 B2 * 2/2007 Hiroshima ........ H01L 29/66757
257/E21.413

(Continued)

FOREIGN PATENT DOCUMENTS

JP    2002-280603    9/2002
KR    10-0460209    12/2004
KR    10-2010-0103213    7/2010

OTHER PUBLICATIONS

Ishihara et al. "Advanced Excimer-Laser Crystallization Process for Single-Crystalline Thin Film Transistors." Thin Solid Films 427 (2003) 77-85.

(Continued)

*Primary Examiner* — Yasser A Abdelaziez
(74) *Attorney, Agent, or Firm* — Muir Patent Law, PLLC

(57) ABSTRACT

An IC device includes a polycrystalline silicon thin film interposed between a first level semiconductor circuit and a second level semiconductor circuit which are formed on a substrate and disposed to vertically overlap each other. The polycrystalline silicon thin film includes at least one silicon single crystal. The at least one silicon single crystal includes a flat horizontal portion, which provides an active region of the second level semiconductor device, and a pin-shaped protruding portion protruding from the flat horizontal portion toward the first level semiconductor device.

10 Claims, 39 Drawing Sheets

(51) Int. Cl.
*H01L 21/3205* (2006.01)
*H01L 23/528* (2006.01)

(52) U.S. Cl.
CPC .. *H01L 21/02675* (2013.01); *H01L 21/32055* (2013.01); *H01L 23/528* (2013.01); *H01L 27/11519* (2013.01); *H01L 27/11526* (2013.01); *H01L 27/11548* (2013.01); *H01L 27/11556* (2013.01); *H01L 27/11565* (2013.01); *H01L 27/11573* (2013.01); *H01L 27/11582* (2013.01)

(56) References Cited

U.S. PATENT DOCUMENTS

| 7,368,333 | B2 | 5/2008 | Kim |
| 7,615,421 | B2 | 11/2009 | Lee et al. |
| 7,723,168 | B2 | 5/2010 | Yin et al. |
| 8,654,584 | B2 | 2/2014 | Kim et al. |
| 2005/0266620 | A1 | 12/2005 | Hiroshima |
| 2007/0022941 | A1* | 2/2007 | Park ................ C30B 29/06 117/3 |
| 2009/0155979 | A1* | 6/2009 | Son ............ H01L 21/823412 438/430 |
| 2010/0207194 | A1 | 8/2010 | Tanaka et al. |
| 2010/0320526 | A1 | 12/2010 | Kidoh et al. |
| 2013/0248975 | A1 | 9/2013 | Hishida et al. |
| 2015/0055413 | A1 | 2/2015 | Alsmeier |
| 2016/0056169 | A1 | 2/2016 | Lee et al. |

OTHER PUBLICATIONS

Arslan et al., "Thick Single Grain Silicon Formation With Microsecond Green Laser Crystallization." ECS Transactions, 50 (8) 35-42 (2012).

* cited by examiner

INTEGRATED CIRCUIT DEVICE INCLUDING POLYCRYSTALLINE SEMICONDUCTOR FILM AND METHOD OF MANUFACTURING THE SAME

CROSS-REFERENCE TO RELATED APPLICATIONS

This application is a divisional application of and claims priority to U.S. patent application Ser. No. 14/804,338, filed Jul. 21, 2015, which claims the benefit of priority to Korean Patent Application No. 10-2014-0109041, filed on Aug. 21, 2014, in the Korean Intellectual Property Office, the disclosure of each of which is incorporated herein in its entirety by reference.

BACKGROUND

The present disclosure relates to an integrated circuit (IC) device and a method of manufacturing the IC device, and more particularly, to an IC device including a polycrystalline semiconductor thin film having a controlled crystal size and position and a method of manufacturing the IC device.

Large capacity and high integration of IC devices including memory devices have become important features according to the demand for multifunctional information and communication devices. Operations of memory devices and structures of operational circuits and interconnection lines which are included in the memory devices have become more complicated due to a reduction in memory cell sizes for high integration. Accordingly, an IC device including a memory device having improved integration density and excellent electrical characteristics is desirable.

SUMMARY

Aspects of the disclosed embodiments provide an integrated circuit (IC) device having improved electrical characteristics and high integration density.

The disclosed embodiments also provide a method of manufacturing an IC device, which minimizes grain boundaries in an active region by increasing the particle size of semiconductor crystals in the active region and thus provides high carrier mobility and improved electrical characteristics.

According to an aspect of the inventive concept, there is provided an IC device including: a first level semiconductor circuit formed on a substrate at a first vertical level; a second level semiconductor circuit formed on the first level semiconductor device at a second vertical level; and a polycrystalline semiconductor thin film interposed between the first level semiconductor circuit and the second level semiconductor circuit. The polycrystalline semiconductor thin film includes at least one semiconductor single crystal, and the at least one semiconductor single crystal includes a flat horizontal portion, which provides an active region of the second level semiconductor circuit, and a pin-shaped protruding portion protruding from the flat horizontal portion toward the first level semiconductor device.

The IC device may further include an inter-device dielectric layer interposed between the first level semiconductor circuit and the polycrystalline semiconductor thin film, the inter-device dielectric layer having a pinhole accommodating the pin-shaped protruding portion.

The inter-device dielectric layer may include a reflective mirror layer.

The IC device may further include: an inter-device dielectric layer interposed between the first level semiconductor circuit and the active region, the inter-device dielectric layer having a pinhole accommodating the pin-shaped protruding portion; and an amorphous silicon seed, positioned between the pin-shaped protruding portion of the silicon single crystal and the first level semiconductor circuit, in the pinhole.

The second level semiconductor circuit may include a memory cell array, and the first level semiconductor circuit may include a control circuit for controlling data input to or data output from the memory cell array.

According to another aspect of the inventive concept, there is provided an IC device including: a peripheral circuit formed on a substrate; a polycrystalline silicon thin film formed on the peripheral circuit; and a memory cell array including a plurality of memory cell strings disposed on the polycrystalline silicon thin film to vertically overlap the peripheral circuit. The polycrystalline silicon thin film is vertically between the peripheral circuit and the memory cell array and includes a plurality of silicon single crystals, and at least a first silicon single crystal selected from the plurality of silicon single crystals includes a flat horizontal portion, which provides an active region of the plurality of memory cell strings, and a vertically protruding portion protruding from the flat portion toward the peripheral circuit.

The IC device may further include: an inter-device dielectric layer interposed between the peripheral circuit and the polycrystalline silicon thin film, the inter-device dielectric layer having a vertical hole accommodating the vertically protruding portion; and an amorphous silicon seed that contacts one end of the vertically protruding portion in the vertical hole.

The IC device may further include a polycrystalline silicon plug that fills a space between the vertically protruding portion and the amorphous silicon seed in the vertical hole. The vertical hole may be a pinhole.

The memory cell array may include: a plurality of word lines that extend parallel to a top surface of the substrate; and a plurality of word line cut regions that define a width of the plurality of word lines in the first direction which is parallel to the top surface of the substrate, and extend parallel to one another in a second direction, which is perpendicular to the first direction. The plurality of silicon single crystals may include a plurality of flat horizontal portions that are regularly arranged, and each of the plurality of flat horizontal portions may have a width that is larger than a shortest distance between two adjacent word line cut regions of the plurality of word line cut regions in the first direction.

The plurality of word line cut regions may be formed to vertically overlap portions of grain boundaries of the plurality of silicon single crystals.

The IC device may further include a plurality of channel regions that pass through the plurality of word lines to extend in a direction which is perpendicular to the top surface of the substrate, wherein the plurality of channel regions are arranged to be separate from a grain boundary of the first silicon single crystal on the first silicon single crystal.

The plurality of silicon single crystals may include a plurality of pin-shaped protruding portions arranged to form a matrix form or a honeycomb structure.

The IC device may further include: an inter-device dielectric layer interposed between the peripheral circuit and the polycrystalline silicon thin film, the inter-device dielectric layer having a pinhole accommodating the vertically protruding portion; and an amorphous silicon seed connected to one end of the vertical protruding portion in the pinhole.

The pinhole may have an inner diameter of about 60 nm to about 100 nm.

The IC device may additionally include a common source region at the a vertical level as the polycrystalline silicon thin film.

According to another aspect of the inventive concept, an integrated circuit (IC) device includes: a peripheral circuit formed at a first vertical level on a substrate; a polycrystalline silicon film formed on the peripheral circuit at a second vertical level above the first vertical level; and a memory cell array formed on the polycrystalline silicon film at a third vertical level above the second vertical level, wherein the memory cell array vertically overlaps the peripheral circuit. The polycrystalline silicon film comprises a plurality a flat horizontal portion, which provides an active region of the plurality of memory cell strings, and a plurality of vertically protruding portions protruding from the flat portion toward the peripheral circuit.

In one embodiment, the polycrystalline silicon film includes a plurality of silicon single crystals, each silicon single crystal including one of the vertically protruding portions.

In one embodiment, the memory cell array is a vertical memory cell array. The memory cell array may include a common source region at the second vertical level.

In one embodiment, the polycrystalline silicon film has a thickness in a range between about 20 nm and about 500 nm.

In one embodiment, the IC device includes an inter-device dielectric layer interposed between the peripheral circuit and the polycrystalline silicon film, the inter-device dielectric layer including a plurality of pinholes accommodating a plurality of respective vertically protruding portions, wherein each pinhole has an inner diameter of about 60 nm to about 100 nm.

According to another aspect of the inventive concept, there is provided a method of manufacturing an IC device, the method including: forming a first level semiconductor device on a substrate; forming an inter-device dielectric layer that covers the first level semiconductor device; forming a pinhole that penetrates at least a portion of the inter-device dielectric layer; forming a polycrystalline silicon thin film including at least one silicon single crystal that extends from an inside of the pinhole up to an upper surface of the inter-device dielectric layer; and forming a second level semiconductor device on the polycrystalline silicon thin film by using the at least one silicon single crystal as an active region.

The forming of the polycrystalline silicon thin film may include: forming an amorphous silicon layer that covers an upper surface of the inter-device dielectric layer while filling the pinhole; applying heat to the amorphous silicon layer from an upper side of the amorphous silicon layer to relieve stress in a portion of the amorphous silicon layer; and solidifying a melted portion of the amorphous silicon layer by using a portion of the amorphous silicon layer, which remains in a solid state in the pinhole, as a seed.

The forming of the polycrystalline silicon thin film may include radiating a laser beam onto the amorphous silicon layer.

The forming of the polycrystalline silicon thin film may include annealing the amorphous silicon layer to form a silicon crystal including a flat portion providing an active region of the second level semiconductor device and a pin-shaped protruding portion protruding from the flat portion toward the first level semiconductor device.

The forming of the inter-device dielectric layer may include forming a reflective mirror layer including a plurality of insulating layers having different reflective indexes, and the forming of the polycrystalline silicon thin film may include: radiating a laser beam onto the amorphous silicon layer from an upper side of the amorphous silicon layer; and reflecting the radiated laser beam by using the reflective mirror layer.

The forming of the pinhole may include: forming a hole having a first width in the inter-device dielectric layer; and forming an insulating spacer that covers an inner wall of the hole and defines the pinhole, which has a second width which is smaller than the first width, in the hole.

In the forming of the pinhole, the pinhole may be formed so that an inner diameter of an inlet of the pinhole is larger than that of a bottom of the pinhole.

According to another aspect of the inventive concept, there is provided a method of manufacturing an IC device, the method including: forming a peripheral circuit on a substrate; forming an inter-device dielectric layer, which covers the peripheral circuit, on the peripheral circuit; forming a pinhole that penetrates at least a portion of the inter-device dielectric layer; forming a polycrystalline silicon thin film including at least one silicon single crystal that extends from an inside of the pinhole up to an upper surface of the inter-device dielectric layer; and forming a memory cell array on the polycrystalline silicon thin film by using the at least one silicon single crystal as an active region, the memory cell array including a plurality of memory cell strings disposed to vertically overlap the peripheral circuit.

The forming of the memory cell array may include forming the plurality of memory cell strings on a silicon single crystal of the polycrystalline silicon thin film by using the silicon single crystal of the polycrystalline silicon thin film as an active region.

The memory cell array may include a plurality of word line cut regions that are separate from one another with the plurality of memory cell strings interposed therebetween, wherein the forming of the memory cell array includes forming the plurality of word line cut regions on one silicon single crystal of the polycrystalline silicon thin film so that at least two word line cut regions of the plurality of word line cut regions vertically overlap the one silicon single crystal and vertically overlap a grain boundary of the one silicon single crystal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
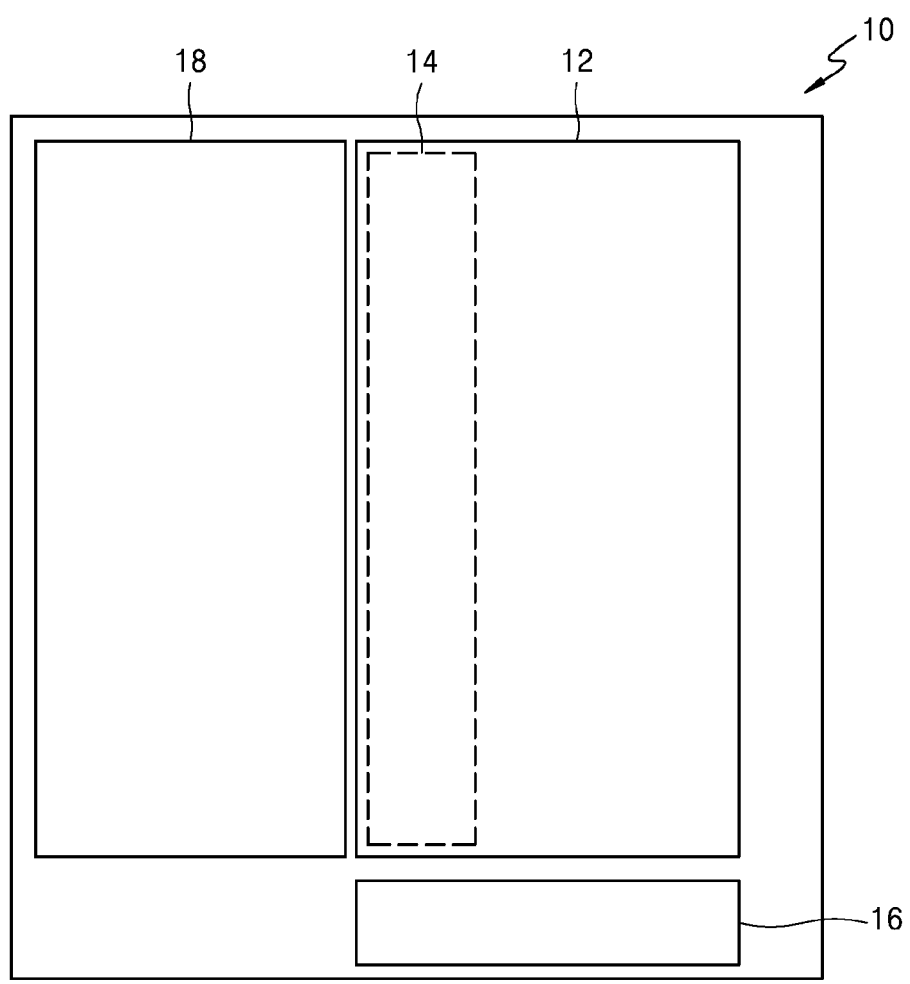
FIG. 1 is a planar layout diagram of main regions of an integrated circuit (IC) device according to an exemplary embodiment of the inventive concept.

Hereinafter, exemplary embodiments of the inventive concept will be described in detail with reference to the accompanying drawings. Like reference numerals in the drawings denote like elements, and thus their redundant description may be omitted.

Various aspects of the inventive concept will now be described more fully with reference to the accompanying drawings, in which exemplary embodiments of the inventive concept are shown. The inventive concept may, however, be embodied in many different forms and should not be construed as being limited to the exemplary embodiments set forth herein.

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that although the terms "first", "second", etc. are used herein to describe members, regions, layers, portions, sections, components, and/or elements in exemplary embodiments of the inventive concept, the members, regions, layers, portions, sections, components, and/or elements should not be limited by these terms. Unless the context indicates otherwise, these terms are only used to distinguish one member, region, portion, section, component, or element from another member, region, portion, section, component, or element, for example as a naming convention. Thus, a first member, region, portion, section, component, or element described below may also be referred to as a second member, region, portion, section, component, or element without departing from the scope of the inventive concept. For example, a first element in one section of the specification may also be referred to as a second element, either at a different section of the specification or in a claim, and similarly, a second element may also be referred to as a first element, without departing from the scope of the inventive concept. In addition, terms not labelled as "first," "second," etc., in the specification may be referred to in the claims using such terms, for naming and clarification purposes.

Unless otherwise defined, all terms (including technical and scientific terms) used herein have the same meaning as commonly understood by those of ordinary skill in the art to which the inventive concept pertains. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

When a certain exemplary embodiment may be implemented differently, a specific process order may be performed differently from the described order. For example, unless the context indicates otherwise, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the exemplary embodiments of the inventive concept should not be construed as being limited to the particular shapes of regions illustrated herein but may be to include deviations in shapes that result, for example, from a manufacturing process.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

FIG. 1 is a planar layout diagram of main regions of an integrated circuit (IC) device 10 according to an exemplary embodiment of the inventive concept. The integrated circuit device may be formed on a semiconductor device, such as, for example, a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

Referring to FIG. 1, the IC device 10 may include a memory cell array region 12, a first peripheral circuit region 14, a second peripheral circuit region 16, and a bonding pad region 18.

Figure 3:
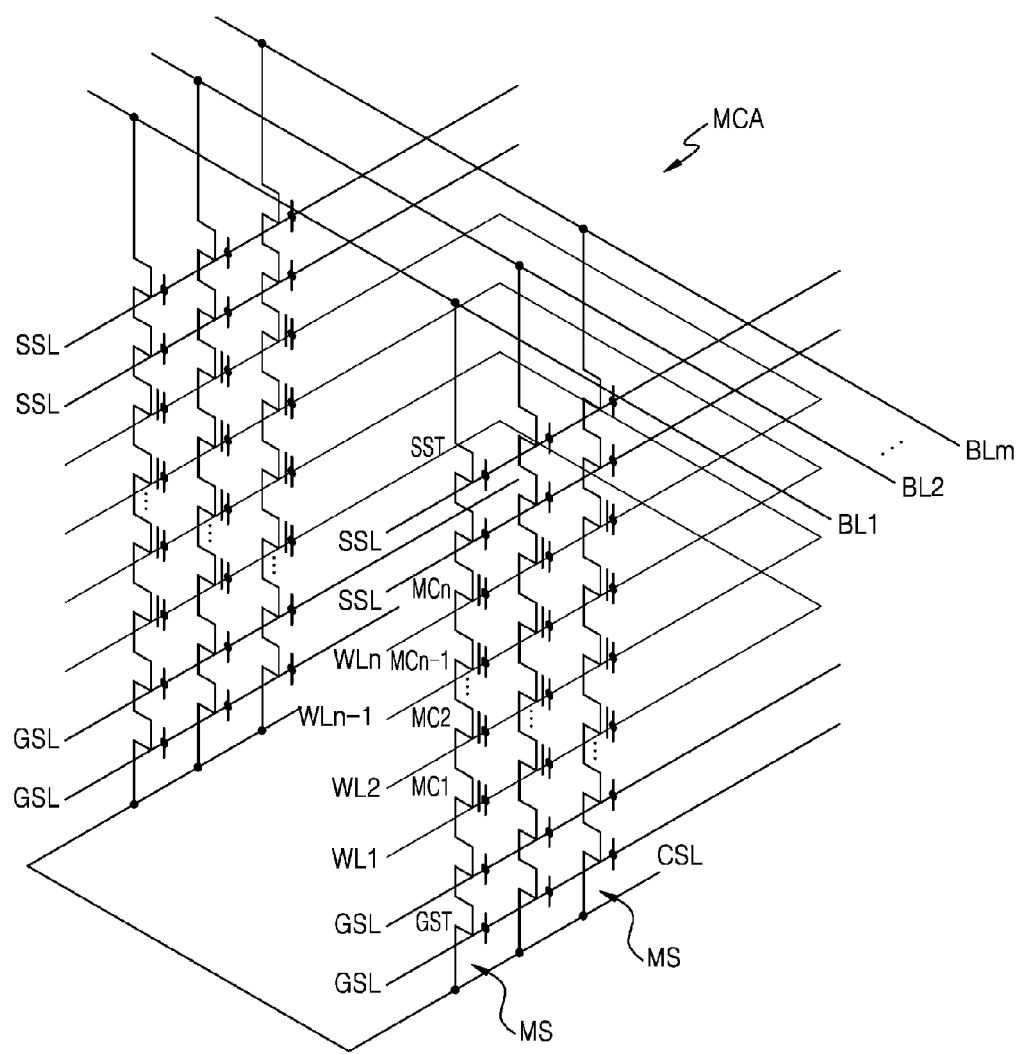
FIG. 3 is an equivalent circuit diagram of a memory cell array of an IC device according to an exemplary embodiment of the inventive concept.

In one embodiment, a memory cell array MCA having a circuit configuration as illustrated in FIG. 3 may be formed in the memory cell array region 12.

The first peripheral circuit region 14 and the second peripheral circuit region 16 may include control units for controlling data input to or data output from the memory cell array region 12. Peripheral circuits for driving vertical type memory cells included in the memory cell array region 12 may be disposed in the first peripheral circuit region 14 and the second peripheral circuit region 16.

In one embodiment, the first peripheral circuit region 14 may be disposed to vertically overlap the memory cell array region 12 and thus reduce a plane size, or planar area of a chip including the IC device 10.

In some exemplary embodiments, peripheral circuits disposed in the first peripheral circuit region 14 may be circuits that process data, which is input to or output from the memory cell array region 12, at high speed. For example, peripheral circuits disposed in the first peripheral circuit region 14 may be a page buffer, a latch circuit, a cache circuit, a column decoder, a sense amplifier, a data input/output (I/O) circuit, or the like. In some instances, circuits such as these are referred to as memory support circuits, while the circuitry that stores data intended for a particular address are referred to as memory storage circuits or a memory cell array. Thus peripheral circuitry may be located at a memory support region and cell array circuitry may be located at a memory storage region.

The second peripheral circuit region 16 may be a memory support region disposed on one side of the memory cell array region 12 and be disposed not to overlap the memory cell array region 12 and/or the first peripheral circuit region 14. Peripheral circuits formed in the second peripheral circuit region 16 may be, for example, a row decoder. Although the second peripheral circuit region 16 in FIG. 1 is disposed not to overlap the memory cell array region 12, a layout of the second peripheral circuit region 16 is not limited to FIG. 1. For example, in one embodiment, the second peripheral circuit region 16 may be disposed under the memory cell array region 12.

The bonding pad region 18 may be formed on another side of the memory cell array region 12. The bonding pad region 18 may be a region, for example, in which interconnection lines connected to word lines of vertical type memory cells of the memory cell array region 12 are formed.

Figure 2A:
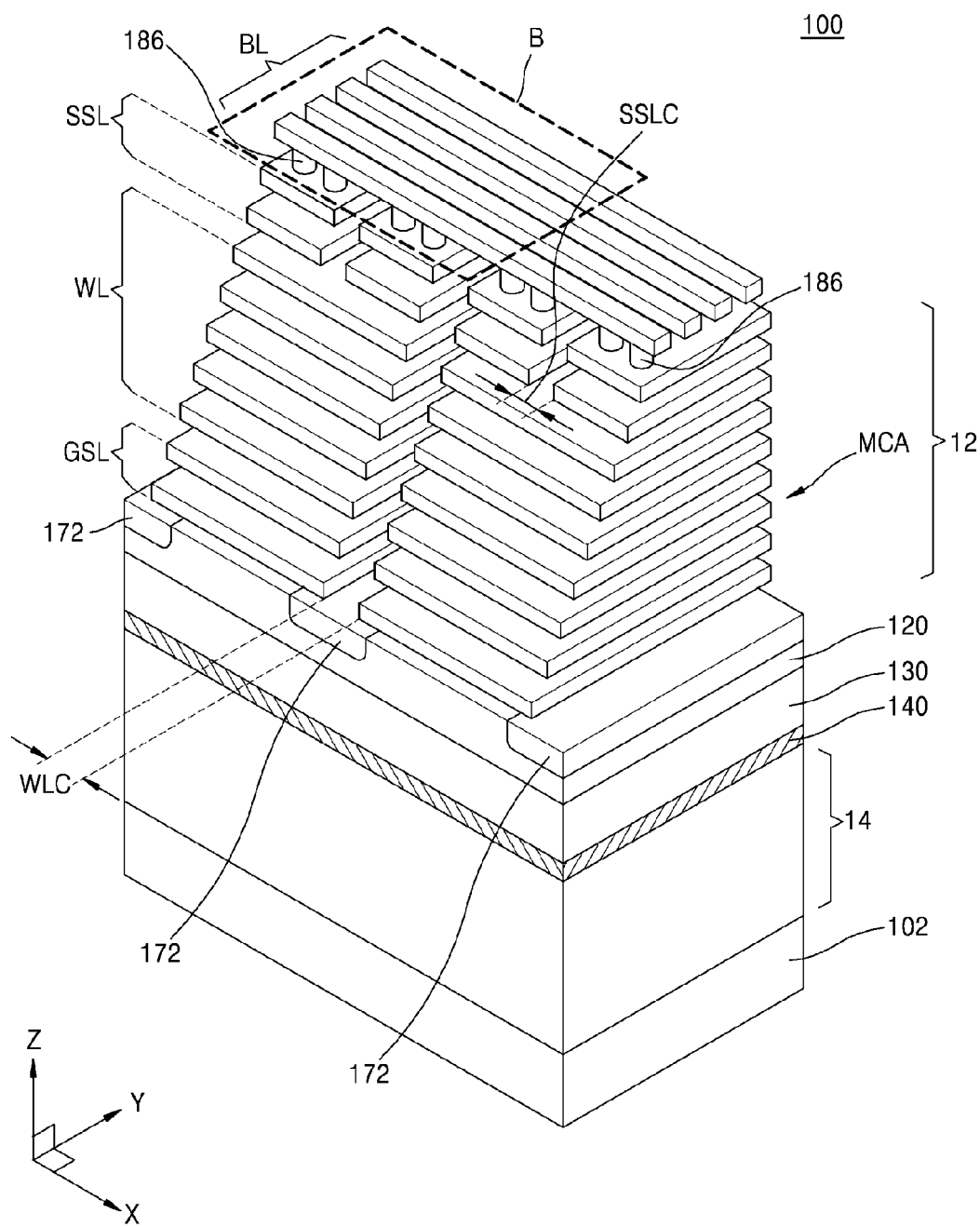
FIGS. 2A through 2C are schematic diagrams illustrating a main structure of an IC device according to an exemplary embodiment of the inventive concept.
Figure 2B:
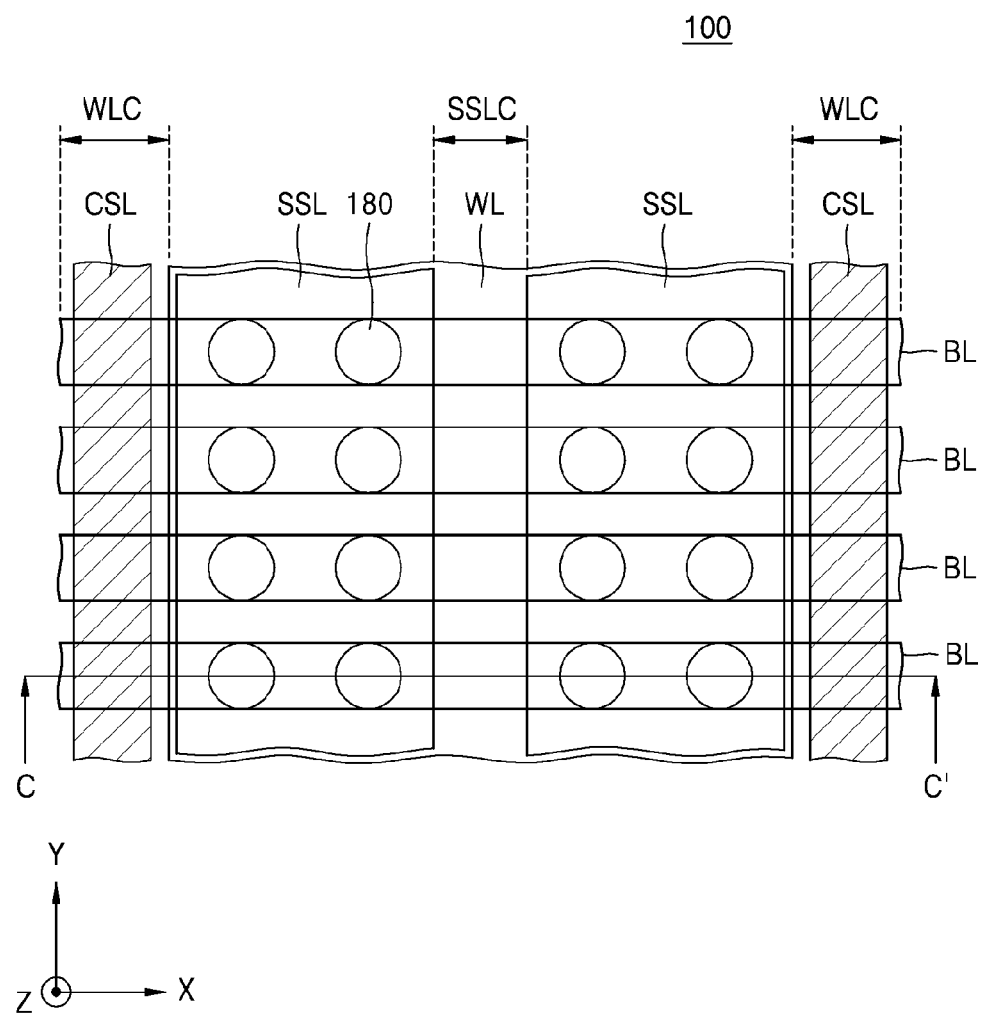
Figure 2C:
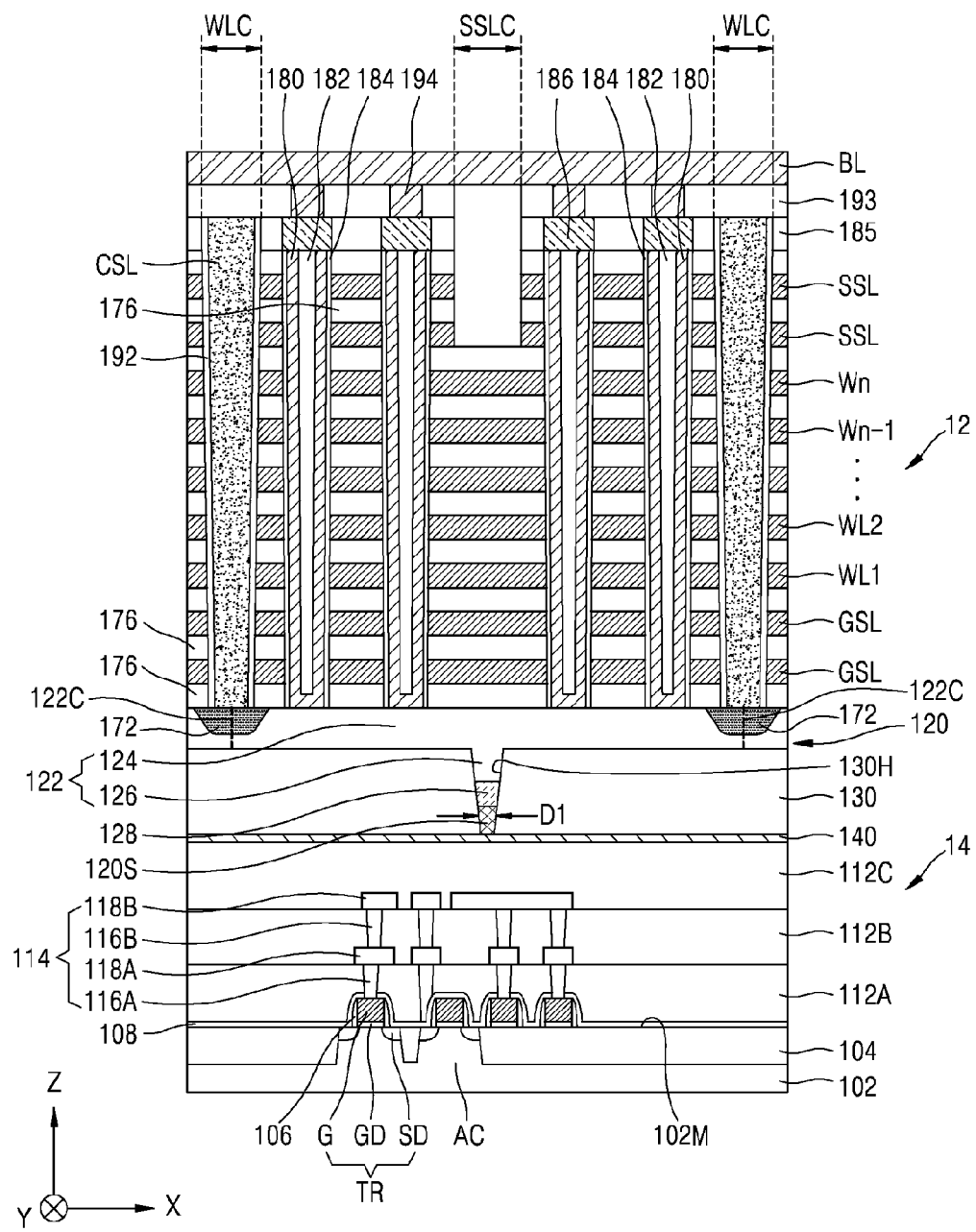

FIGS. 2A through 2C are schematic diagrams illustrating a main structure of an IC device 100 according to an exemplary embodiment of the inventive concept. FIG. 2A is a perspective view of main elements of the IC device 100 that includes the memory cell array region 12 and the first peripheral circuit region 14, illustrated in FIG. 1. FIG. 2B is a planar layout diagram of main elements of a portion indicated by a dotted line B in FIG. 2A. FIG. 2C is a schematic cross-sectional view taken along a line C-C' of FIG. 2B.

Referring to FIGS. 2A through 2C, the IC device 100 includes a first peripheral circuit region 14 formed at a first level (e.g., first vertical level) on a substrate 102, a memory cell array region 12 formed at a second level (e.g., second vertical level) on the substrate 102, and a polycrystalline silicon thin film 120 interposed between the peripheral circuit region 14 and the memory cell array region 12.

The term "level" used in the present specification means a height from the substrate 102 toward a vertical direction (the Z direction in FIGS. 2A through 2C), and may be referred to at times as a vertical level. As shown in the example of FIGS. 2A and 2C, the first level is closer to the substrate 102 than the second level is to the substrate 102.

In some exemplary embodiments, the substrate 102 may have a main surface 102M extending in the X direction and the Y direction. The substrate 102 may include, for example, Si, Ge, or SiGe. In some exemplary embodiments, the substrate 102 may be a silicon-on-insulator (SOI) substrate or a germanium-on-insulator (GeOI) substrate.

The polycrystalline silicon thin film 120 may include at least one (e.g., a first) silicon single crystal 122. The first silicon single crystal 122 (e.g., a monocrystalline portion of the polycrystalline silicon thin film 120) provides an active region of the memory cell array region 12. In FIG. 2C, grain boundaries between the first silicon single crystal 122 and silicon grains surrounding the first silicon single crystal 122

(e.g., between two monocrystalline portions, or two single crystals, of the polycrystalline silicon thin film 120) are indicated by a dotted line 122C. In the present specification, the term "one silicon single crystal" or "a first silicon single crystal" refers to one silicon grain that forms part of polycrystalline silicon.

As illustrated in FIG. 2C, the first silicon single crystal 122 includes a flat portion 124 that provides an active region of the memory cell array region 12, and a protruding portion 126 that protrudes from the flat portion 124 toward the first peripheral circuit region 14. The protruding portion may be, for example, a pin-shaped protruding portion. The flat portion 124 and protruding portion 126 may be respectively referred to as a horizontal portion and a vertical portion. For example, they may be referred to as a plated-shaped portion and a bump-shaped portion that protrudes vertically from the plate-shaped portion (e.g., that protrudes in a direction perpendicular to the surface and does not extend horizontally along the surface in any particular direction more than in a different particular direction along the surface). In certain embodiments, the closer the protruding portion 126 is to the flat portion 124 from a tip of the protruding portion 126 to a surface of the flat portion, the larger the width of the pin-shaped protruding portion 126 may be. Therefore, the protruding portion 126 may have a gradually narrowing shape as it extends away from the flat portion 124.

An inter-device dielectric layer 130, in which a vertical hole (e.g., pinhole) 130H accommodating the vertical (e.g., pin-shaped, or bump-shaped) protruding portion 126 is formed, is formed between the first peripheral circuit region 14 and the polycrystalline silicon thin film 120. An amorphous silicon seed 120S may exist in the bottom of an internal space of the pinhole 130H. The amorphous silicon seed 120S may be positioned between the pin-shaped protruding portion 126 of the silicon single crystal 122 and the first peripheral circuit region 14. In the internal space of the pinhole 130H, a space between the amorphous silicon seed 120S and the pin-shaped protruding portion 126 may be filled with a polycrystalline silicon plug 128. The polycrystalline silicon plug 128 may be formed of polycrystalline silicon. In some exemplary embodiments, the polycrystalline silicon plug 128 does not exist in the pinhole 130H. In this case, in the pinhole 130h, the amorphous silicon seed 120S may contact the pin-shaped protruding portion 126 of the silicon single crystal 122. The combined protruding portion 126, optional polycrystalline silicon plug 128, and amorphous silicon seed 120S may be collectively referred to as a vertical protrusion or protruding portion, or more specifically a spike-shaped vertical protrusion or protruding portion. The combined protruding portion may have the form of a through via, for example, in some embodiments, with a more tapered width than a through via electrode. The combined protruding portion may be referred to as a pillar portion, or as having a pillar shape. This combined protrusion may include, for example, a monocrystalline portion, and polycrystalline portion, and an amorphous portion.

In the substrate 102, an active region AC for peripheral circuits may be defined by a device isolation layer 104. A plurality of transistors TR of the first peripheral circuit region 14 may be formed on the active region AC of the substrate 102. Each of the plurality of transistors TR may include a gate G, a gate insulating layer GD, and a source/drain region SD. Both (e.g., opposite) sidewalls of the gate G may be covered with an insulating spacer 106, and an etch stop layer 108 may be formed on the gate G and the insulating spacer 106. The etch stop layer 108 may include an insulating material, such as silicon nitride or silicon oxynitride.

A plurality of interlayer insulating layers 112A, 112B, and 112C may be sequentially stacked on the etch stop layer 108. Each of the plurality of interlayer insulating layers 112A, 112B, and 112C may include, for example, silicon oxide, silicon nitride, or silicon oxynitride.

The first peripheral circuit region 14 includes a multi-layer wiring structure 114 that is electrically connected to the plurality of transistors TR. The multi-layer wiring structure 114 may be insulated by the plurality of interlayer insulating layers 112A, 112B, and 112C.

The multi-layer wiring structure 114 may include a first contact 116A, a first wiring layer 118A, a second contact 116B, and a second wiring layer 118B, which are sequentially stacked on the substrate 102 and are electrically connected to each other. In some exemplary embodiments, the first wiring layer 118A and the second wiring layer 118B may be formed of a conductive material such as metal, conductive metal nitride, metal silicide, or a combination thereof. For example, the first wiring layer 118A and the second wiring layer 118B may include a conductive material, such as tungsten, molybdenum, titanium, cobalt, tantalum, nickel, tungsten silicide, titanium silicide, cobalt silicide, tantalum silicide, or nickel silicide.

Although the multi-layer wiring structure 114 in FIG. 2C is a double layer wiring structure including the first and second wiring layers 118A and 118B, the inventive concept is not limited thereto. For example, the multi-layer wiring structure 114 may be a multi-layer wiring structure including three or more layers according to a layout of the first peripheral circuit region 14 and a type and arrangement of the gate G. In the multi-layer wiring structure 114 illustrated in FIG. 2C, the second wiring layer 118B is regarded as the uppermost wiring layer of wiring layers forming the multi-layer wiring structure 114. In addition, the interlayer insulating layer 112C of the plurality of interlayer insulating layers 112A, 112B, and 112C is regarded as the uppermost interlayer insulating layer covering the second wiring layer 118B that is the uppermost wiring layer.

The pin-shaped protruding portion 126 of the silicon single crystal 122 is separate from the second wiring layer 118B (i.e., the uppermost wiring layer in the first peripheral circuit region 14) with the interlayer insulating layer 112 (i.e., the uppermost interlayer insulating layer in the first peripheral circuit region 14) interposed therebetween.

An insulating thin film 140 extending parallel to the substrate 102 in the X direction is formed between the uppermost interlayer insulating layer 112C in the first peripheral circuit region 14 and the inter-device dielectric layer 130. The insulating thin film 140 may be exposed at the bottom of the pinhole 130H and have an upper surface that contacts the amorphous silicon seed 120S.

The insulating thin film 140 may be formed of an insulating material that is different from that of the inter-device dielectric layer 130. In some exemplary embodiments, the insulating thin film 140 may be formed of a material that has etch selectivity which is different from that of the material of the inter-device dielectric layer 130. For example, the insulating thin film 140 may be formed of silicon nitride, and the inter-device dielectric layer 130 may be formed of silicon oxide. However, the inventive concept is not limited thereto.

FIG. 3 is an equivalent circuit diagram of the memory cell array MCA of the memory cell array region 12 illustrated in FIGS. 1 through 2C. FIG. 3 illustrates an equivalent circuit diagram of a NAND flash memory device having a vertical channel structure.

Referring to FIG. 3, the memory cell array MCA includes a plurality of memory cell strings MS. The memory cell array MCA includes a plurality of bit lines BL1, BL2, . . . , and BLm, a plurality of word lines WL1, WL2, . . . , WLn−1, and WLn, at least one string selection line SSL, at least one ground selection line GSL, and a common source line CSL. The plurality of memory cell strings MS are formed between the plurality of bit lines BL1, BL2, . . . , and BLm and the common source line CSL.

Each of the memory cell strings MS includes a string selection transistor SST, a ground selection transistor GST, and a plurality of memory cell transistors MC1, MC2, . . . , MCn−1, and MCn. A drain region of the string selection transistor SST is connected to a bit line BL1, BL2, . . . , or BLm, and a source region of the ground selection transistor GST is connected to the common source line CSL. The common source line CSL is a region in which source regions of ground selection transistors GST are connected in common.

The string selection transistor SST may be connected to the string selection line SSL, and the ground selection transistor GST may be connected to the ground selection line GSL. The plurality of memory cell transistors MC1, MC2, . . . , MCn−1, and MCn may be connected respectively to the word lines WL1, WL2, . . . , WLn−1, and WLn.

The memory cell array MCA may be arranged in a three-dimensional (3D) structure. The plurality of memory cell transistors MC1, MC2, . . . , MCn−1, and MCn forming the memory cell string MS may be serially connected in a direction (the Z direction in FIGS. 2A through 2C) that is perpendicular to a plane (the X-Y plane in FIGS. 2A through 2C) which is parallel to the flat portion 124 of at least one silicon single crystal 122 included in the polycrystalline silicon thin film 120 illustrated in FIGS. 2A through 2C. Accordingly, a channel region of the string selection transistor SST, a channel region of the ground selection transistor GST, and a channel region of each of the plurality of memory cell transistors MC1, MC2, . . . , MCn−1, and MCn may be formed to extend in the direction that is substantially perpendicular to the plane (the X-Y plane in FIGS. 2A through 2C) which is parallel to the flat portion 124 of a silicon single crystal 122 included in the polycrystalline silicon thin film 120.

The memory cell array MCA having a configuration exemplified in FIG. 3 may be electrically connected to the plurality of transistors TR, formed in the first peripheral circuit region 14, via a wiring structure (not shown) penetrating the polycrystalline silicon thin film 120.

Referring back to FIGS. 2A through 2C, the polycrystalline silicon thin film 120 formed on the uppermost interlayer insulating layer 112C of the first peripheral circuit region 14 may be formed to vertically overlap the memory cell array region 12 and the first peripheral circuit region 14 (refer to FIG. 1). In some embodiments, the polycrystalline silicon thin film 120 may formed to vertically overlap the second peripheral circuit region 16 (refer to FIG. 1). In some other embodiments, the polycrystalline silicon thin film 120 may not extend up to the second peripheral circuit region 16.

The flat portion 124 of at least one silicon single crystal 122 included in the polycrystalline silicon thin film 120 provides an active region of the plurality of memory cell strings MS (refer to FIG. 3) disposed on the flat portion 124 to vertically overlap the first peripheral circuit region 14. In some embodiments, the polycrystalline silicon thin film 120 may have a thickness (e.g., in a vertical direction) of about 20 nm to about 500 nm. However, the inventive concept is not limited thereto.

In the memory cell array 12, the plurality of word lines WL1, WL2, . . . , WLn−1, and WLn may be formed to extend parallel to an extending direction of a main surface of the substrate 102 (e.g., a top or bottom surface) and to vertically overlap one another on the substrate 102. The plurality of word lines WL1, WL2, . . . , WLn−1, and WLn are repeatedly disposed while being separate from each other at regular intervals by a plurality of word line cut regions WLC in a first direction (the X direction in FIGS. 2A through 2C) that is parallel to an extending direction of the main surface of the substrate 120. The plurality of word line cut regions WLC extend parallel to one another in a second direction (the Y direction in FIGS. 2A through 2C), which is parallel to the extending direction of the main surface of the substrate 120 and is perpendicular to the first direction, while defining the width of the plurality of word lines WL1, WL2, . . . , WLn−1, and WLn in the first direction (the X direction in FIGS. 2A through 2C) that is parallel to the extending direction of the main surface of the substrate 120.

A common source region 172 extending in an extending direction (the Y direction in FIGS. 2A through 2C) of the word line cut regions WLC of the memory cell array MCA may be formed in the flat portion 124 of at least one silicon single crystal 122 of the polycrystalline silicon thin film 120. The common source region 172 may be, for example, an impurity region highly doped with a certain type of (e.g., n-type) impurities. An opposite type well (e.g., p-well (not shown)) may be formed in the polycrystalline silicon thin film 120. The p-well formed in the common source region 172 and the polycrystalline silicon thin film 120 may form a p-n junction diode. The common source region 172 may function as a source region that supplies current to vertical type memory cells.

At least one ground selection line GSL, the plurality of word lines WL1, WL2, . . . , WLn−1, and WLn, and at least one string selection line SSL may be stacked in turn between two adjacent word line cut regions WLC on the polycrystalline silicon thin film 120. Here, two string selection lines SSL that are adjacent to each other in the X direction are separate from each other with a string selection line cut region SSLC interposed therebetween.

The at least one ground selection line GSL, each of the plurality of word lines WL1, WL2, . . . , WLn−1, and WLn, and the at least one string selection line SSL may be formed, for example, of metal, metal silicide, semiconductor doped with impurities, or a combination thereof. For example, the at least one ground selection line GSL, each of the plurality of word lines WL1, WL2, . . . , WLn−1, and WLn, and the at least one string selection line SSL may include metal (such as tungsten, nickel, cobalt, or tantalum), metal silicide (such as tungsten silicide, nickel silicide, cobalt silicide, or tantalum silicide), polysilicon doped with impurities, or a combination thereof. However, the inventive concept is not limited thereto.

Insulating layers 176 are interposed between the polycrystalline silicon thin film 120 and the at least one ground selection line GSL, and between each of the at least one ground selection line GSL, the plurality of word lines WL1, WL2, . . . , WLn−1, and WLn, and the at least one string selection line SSL. The insulating layers 176 may be formed of silicon oxide, silicon nitride, or silicon oxynitride, but are not limited thereto.

A plurality of channel regions 180 may pass through the at least one ground selection line GSL, the plurality of word lines WL1, WL2, . . . , WLn−1, and WLn, the at least one string selection line SSL, and a plurality of insulating layers 176 to extend in a direction (the Z direction in FIGS. 2A through 2C) that is perpendicular to the main surface of the substrate 102. The plurality of channel regions 180 may be arranged to be separate from each other at regular intervals in the X direction and the Y direction. The arrangement of the plurality of channel regions 180 exemplified in FIG. 2B is only an example and may be variously modified and changed.

The plurality of channel regions 180 are disposed to be separate from the grain boundaries 122C of the at least one silicon single crystal 122 on the at least one silicon single crystal 122. The plurality of memory cell strings MS (refer to FIG. 3) that are formed around the plurality of channel regions 180 may be formed not to overlap the grain boundaries 122C of the at least one silicon single crystal 122 on the at least one silicon single crystal 122.

In some exemplary embodiments, the plurality of channel regions 180 may include doped polysilicon and/or non-doped polysilicon.

Each of the plurality of channel regions 180 may have a cylindrical shape. An internal space of each of the plurality of channel regions 180 may be filled with a buried insulating layer 182. In some other exemplary embodiments, each of the plurality of channel regions 180 may have a pillar structure (e.g., rather than a cup-shaped structure). In this case, the buried insulating layer 182 may be omitted.

Gate insulating layers 184 may be interposed between each of the plurality of channel regions 180 and each of the at least one ground selection line GSL, plurality of word lines WL1, WL2, . . . , WLn−1, and WLn, and at least one string selection line SSL. The gate insulating layer 184 may include, for example, a tunnel insulating layer, a charge storage layer, and a blocking insulating layer, sequentially stacked from the plurality of channel regions 180. The tunnel insulating layer may include silicon oxide, hafnium oxide, aluminum oxide, zirconium oxide, tantalum oxide, or the like. The charge storage layer is a region in which electrons tunneling the tunnel insulating layer from the plurality of channel regions 180 may be stored. The charge storage layer may include silicon nitride, boron nitride, silicon boron nitride, or impurity-doped polysilicon. The blocking insulating layer may be formed of silicon oxide, silicon nitride, hafnium oxide, aluminum oxide, zirconium oxide, tantalum oxide, or a combination thereof. The blocking insulating layer may include a dielectric material having a higher dielectric constant than silicon oxide. In some exemplary embodiments, barrier metal layers (not shown) may be further formed between the gate insulating layer 184 and each of the at least one ground selection line GSL, plurality of word lines WL1, WL2, . . . , WLn−1, and WLn, and at least one string selection line SSL.

A common source line CSL may be formed on the common source region 172 formed in the polycrystalline silicon thin film 120. The common source line CSL may extend in the Y direction in the word line cut region WLC.

An insulating spacer 192 covering a sidewall of the common source line CSL may be formed in the word line cut region WLC. The insulating spacer 192 may electrically insulate the plurality of word lines WL1, WL2, . . . , WLn−1, and WLn from the common source line CSL.

The ground selection line GSL, and a portion of the channel region 180 and a portion of the gate insulating layer 184 which are adjacent to the ground selection line GSL may form the ground selection transistor GST illustrated in FIG. 3. The plurality of word lines WL1, WL2, . . . , WLn−1, and WLn, and a portion of the channel region 180 and a portion of the gate insulating layer 184 which are adjacent to the plurality of word lines WL1, WL2, . . . , WLn−1, and WLn may form the plurality of memory cell transistors MC1, MC2, . . . , MCn−1, and MCn illustrated in FIG. 3. The string selection line SSL, and a portion of the channel region 180 and a portion of the gate insulating layer 184 which are adjacent to the string selection line SSL may form the string selection transistor SST illustrated in FIG. 3.

A drain region 186 may be formed on the plurality of channel regions 180 and the buried insulating layer 182. In some exemplary embodiments, the drain region 186 may include impurity-doped polysilicon.

As illustrated in FIG. 2A, the plurality of channel regions 180 formed to pass through the at least one ground selection line GSL, the plurality of word lines WL1, WL2, . . . , WLn−1, and WLn, and the at least one string selection line SSL may be connected to the plurality of bit lines BL1, BL2, . . . , and BLm via the drain region 186. In some exemplary embodiments, the plurality of bit lines BL1, BL2, . . . , and BLm may be formed of a non-metallic conductive material such as polysilicon or the like, a metal, or a combination thereof.

The common source line CSL may be in the word line cut region WLC, and the string selection line cut region SSLC may be between two word line cut regions WLC that are adjacent to each other.

Figure 4A:
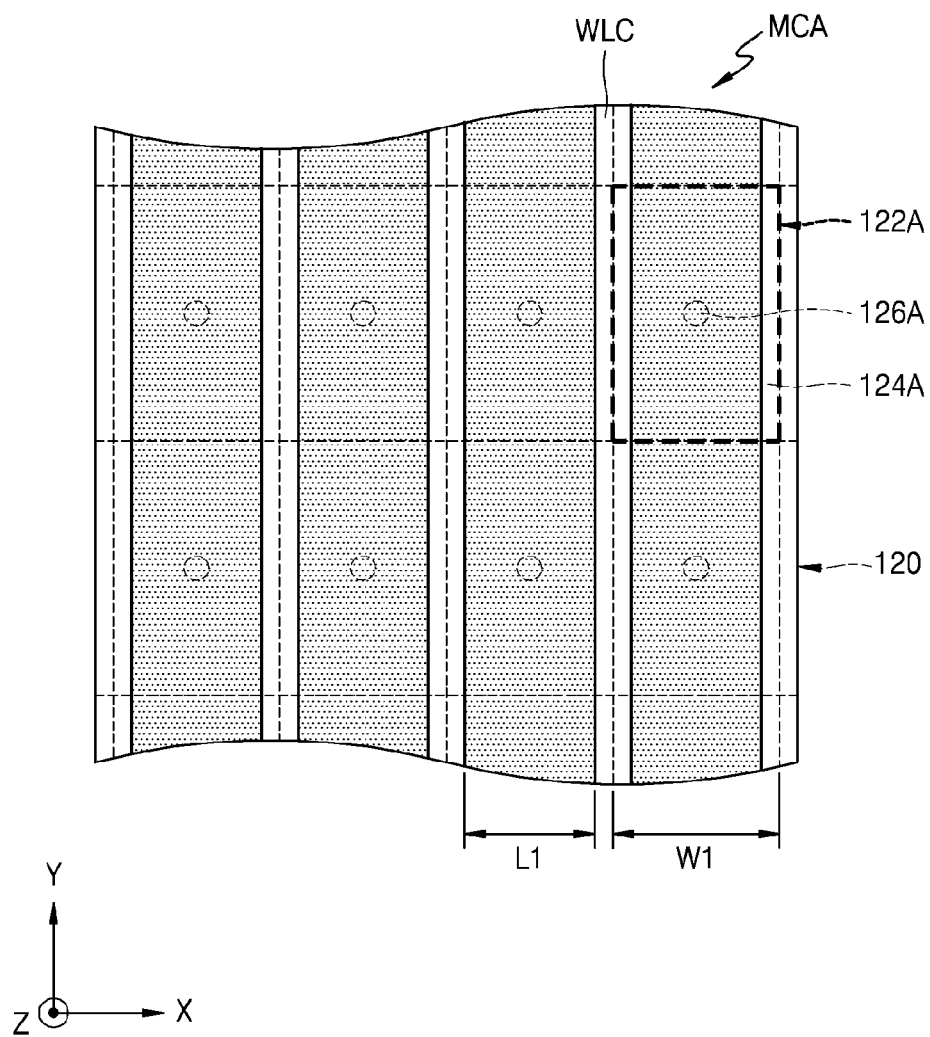
FIGS. 4A and 4B are layout diagrams of some main elements that are applicable to an IC device according to an exemplary embodiment of the inventive concept.
Figure 4B:
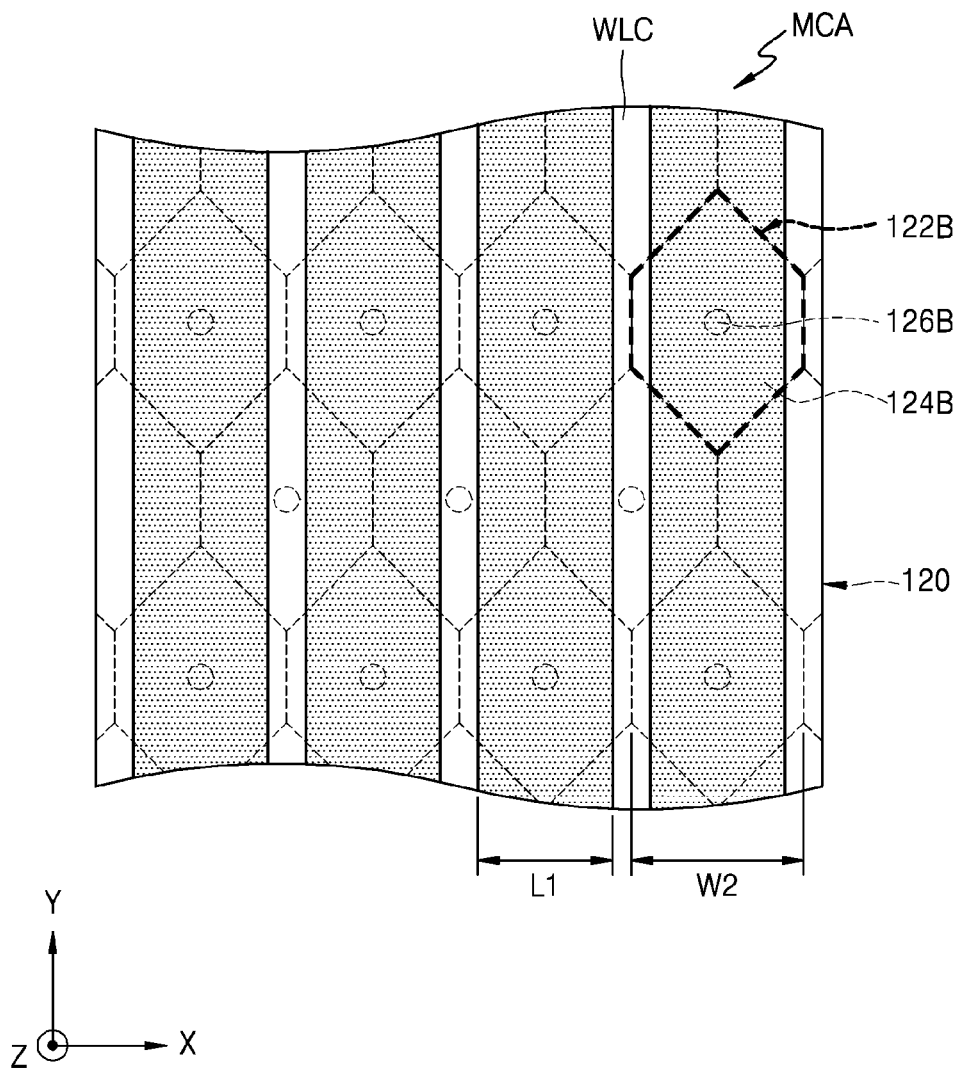

FIGS. 4A and 4B are layout diagrams of some main elements that are applicable to the IC device 100 illustrated in FIGS. 2A through 2C. Various planar shapes of the silicon single crystal 122 of the polycrystalline silicon thin film 120 illustrated in FIGS. 2A through 2C are illustrated in FIGS. 4A and 4B.

In FIGS. 4A and 4B, the polycrystalline silicon thin film 120 may include a plurality of silicon single crystals 122A and/or 122B that have various planar shapes and are regularly arranged. In FIG. 4A, a flat portion 124A and a pin-shaped protruding portion 126A of each of the plurality of silicon single crystals 122A are indicated by a dotted line. In FIG. 4B, a flat portion 124B and a pin-shaped protruding portion 126B of each of the plurality of silicon single crystals 122B are indicated by a dotted line. The positions of the dotted lines indicating planar shapes of the flat portions 124A and 124B indicates the positions of grain boundaries of the plurality of silicon single crystals 122A and 122B.

In some exemplary embodiments, as illustrated in FIG. 4A, the polycrystalline silicon thin film 120 may include the plurality of silicon single crystals 122A arranged in a matrix form, with respect to the X and Y axes. A plurality of pin-shaped protruding portions 126A of the plurality of silicon single crystal 122A may also be arranged in a matrix form. As shown in the embodiment of FIG. 4A, a plurality of flat portions 124A connected to the plurality of pin-shaped protruding portions 126A may have substantially quadrangular (e.g., rectangular) planar shapes and may be regularly arranged in a matrix form. In some exemplary embodiments, each of the plurality of flat portions 124A may have a quadrangular planar shape whose corner is round-shaped.

A memory cell array MCA may be formed on the plurality of silicon single crystals 122A by using the polycrystalline silicon thin film 120, which includes the plurality of silicon single crystals 122A, as an active region. In FIG. 4A, each of the plurality of flat portions 124A of the plurality of silicon single crystals 122A may be formed to have a width W1 that is larger than a shortest distance L1 between two adjacent word line cut regions WLC of a plurality of word line cut regions WLC included in the memory cell array MCA. The plurality of word line cut regions WLC may be disposed to vertically overlap portions of grain boundaries of the plurality of silicon single crystals 122A, indicated by the dotted line in FIG. 4A. In addition, the plurality of pin-shaped protruding portions 126A of the plurality of silicon single crystals 122A may be disposed not to vertically overlap the plurality of word line cut regions WLC. A plurality of memory cell strings MS (refer to FIG. 3) may be disposed on a flat portion 124A of any one of the plurality of silicon single crystals 122A.

In some other exemplary embodiments, as illustrated in FIG. 4B, the polycrystalline silicon thin film 120 may include the plurality of silicon single crystals 122B arranged to form a honeycomb structure. A plurality of pin-shaped protruding portions 126B of the plurality of silicon single crystal 122B may also be arranged to form a honeycomb structure. A plurality of flat portions 124B connected to the plurality of pin-shaped protruding portions 126B have substantially hexagonal planar shapes and are arranged to form a honeycomb structure. In some exemplary embodiments, each of the plurality of flat portions 124B may have a hexagonal planar shape whose corner is round-shaped.

A memory cell array MCA may be formed on the plurality of silicon single crystals 122B by using the polycrystalline silicon thin film 120, which includes the plurality of silicon single crystals 122B, as an active region. In FIG. 4B, each of the plurality of flat portions 124B of the plurality of silicon single crystals 122B may be formed to have a width W2 (e.g., between two opposite sides) that is larger than a shortest distance L2 between two adjacent word line cut regions WLC of a plurality of word line cut regions WLC included in the memory cell array MCA. The plurality of word line cut regions WLC may be disposed to vertically overlap portions of grain boundaries of the plurality of silicon single crystals 122B, indicated by the dotted line in FIG. 4B. In addition, some of the plurality of pin-shaped protruding portions 126B of the plurality of silicon single crystal 122B may be disposed to vertically overlap the plurality of word line cut regions WLC, and some of the plurality of pin-shaped protruding portions 126B may be disposed not to overlap the plurality of word line cut regions WLC. A plurality of memory cell strings MS (refer to FIG. 3) may be disposed on a flat portion 124B of any one of the plurality of silicon single crystals 122B.

Figure 5:
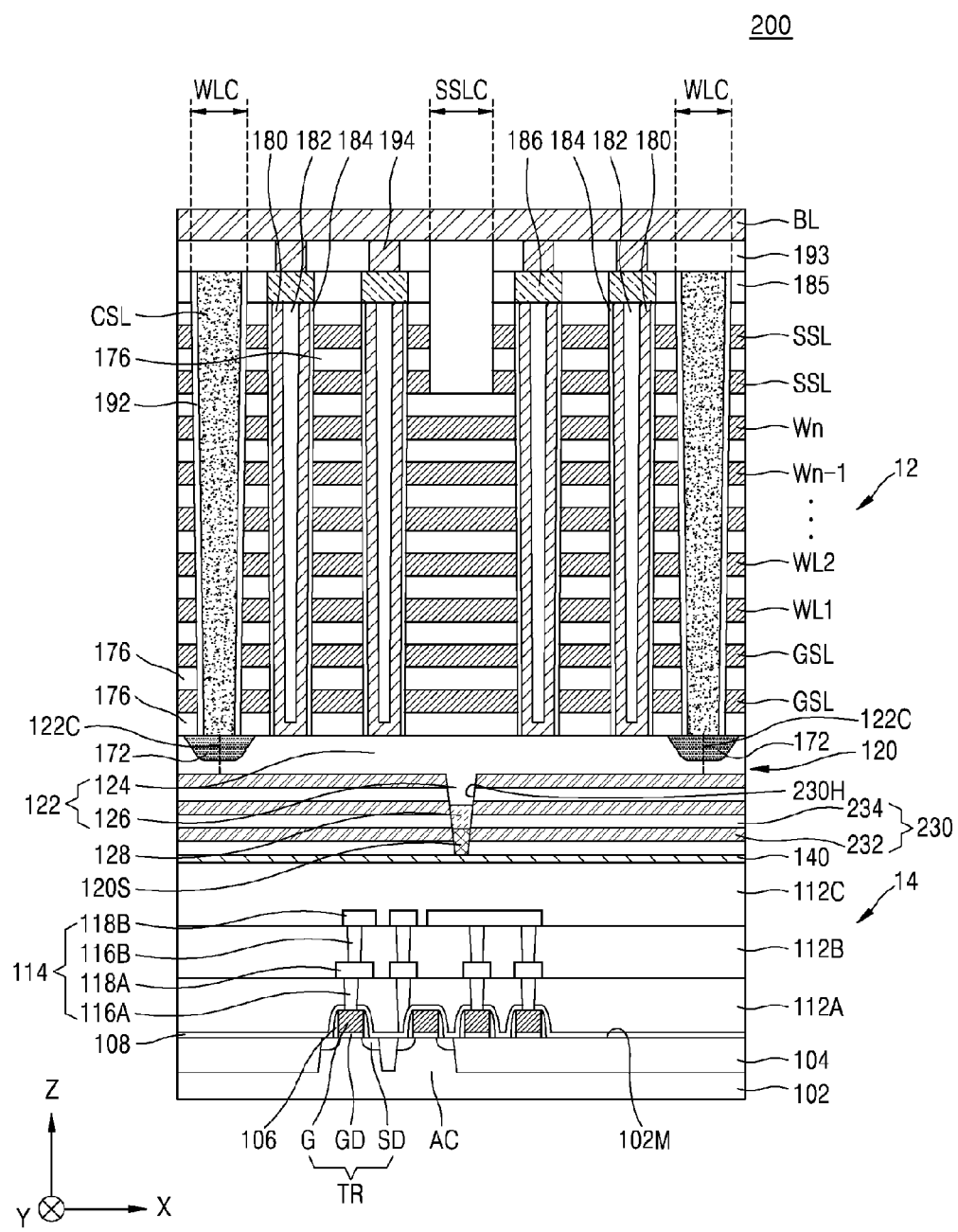
FIG. 5 is a schematic cross-sectional view illustrating a main structure of an IC device according to another exemplary embodiment of the inventive concept.

FIG. 5 is a schematic cross-sectional view illustrating a main structure of an IC device 200 according to another exemplary embodiment of the inventive concept.

The IC device 200 illustrated in FIG. 5 has substantially the same structure as the IC device 100 illustrated in FIGS. 2A through 2C, except that the IC device 200 includes an inter-device dielectric layer 230 formed of a reflective mirror layer instead of the inter-device dielectric layer 130 described with reference to FIGS. 2A through 2C.

Referring to FIG. 5, the inter-device dielectric layer 230 is formed between a first peripheral circuit region 14 and a polycrystalline silicon thin film 120. A pinhole 230H accommodating a pin-shaped protruding portion 126 of a silicon single crystal 122 is formed in the inter-device dielectric layer 230. An amorphous silicon seed 120S exists around the bottom of an internal space of the pinhole 230H.

The inter-device dielectric layer 230 includes a reflective mirror layer including a plurality of insulating thin films having different reflective indexes. In some exemplary embodiments, the plurality of insulating thin films may include a first insulating thin film 232 having a first reflective index and a second insulating thin film 234 having a second reflective index that is lower than the first reflective index. In some exemplary embodiments, the first insulating thin film 232 may be formed of silicon nitride, and the second insulating thin film 234 may be formed of silicon oxide. However, the inventive concept is not limited thereto. According to aspects of the inventive concept, the material of the inter-device dielectric layer 230 may be any one of insulating materials (or a combination thereof) that may perform a function of reflecting light, which is incident on the inter-device dielectric layer 230 from the upper side of the inter-device dielectric layer 230, to the upper side of the inter-device dielectric layer 230, but is not specifically limited thereto. For example, the inter-device dielectric layer 230 may include a plurality of insulating thin films formed of different materials. Alternatively, the inter-device dielectric layer 230 may include an insulating structure in which the first insulating thin film 232 having the first reflective index and the second insulating thin film 234 having the second reflective index that is lower than the first reflective index are alternately stacked at least one time.

In some exemplary embodiments, the first insulating thin film 232 and the second insulating thin film 234 may be formed of different materials selected from silicon oxide, silicon nitride, silicon oxynitride, titanium oxide, tantalum oxide, hafnium oxide, zinc oxide, zirconium oxide, aluminum oxide, aluminum nitride, and niobium oxide.

In some exemplary embodiments, the inter-device dielectric layer 230 may include a distributed bragg reflector (DBR) structure. The DBR structure may reflect at least some of light that is incident on the DBR structure after penetrating the inter-device dielectric layer 230 from the upper side of the inter-device dielectric layer 230.

In some exemplary embodiments, the DBR structure may include a multiple reflective layer including an insulating structure in which a first layer having a first reflective index and a second layer having a second reflective index that is lower than the first reflective index are alternately stacked at least one time. Each of the first and second layers may be formed of an oxide or nitride of any one selected from the group consisting of Si, Zr, Ta, Ti, Hf, and Al. In some exemplary embodiments, the first layer and the second layer may be formed of different materials selected from $SiO_x$ ($0<x\leq2$), $TiO_2$, $Ti_3O_5$, $Ti_2O_3$, $TiO$, $Ta_2O_5$, $ZrO_2$, $Nb_2O_5$, $CeO_2$, $ZnS$, $Al_2O_3$, $SiN$, siloxane polymer, and $MgF_2$. For example, the first layer may be formed of any one selected from $SiN$, $AlN$, $TiO_2$, and $SiO_x$ ($0<x<2$), and the second layer may be formed of any one selected from $SiO_2$ and $Al_2O_3$. Each of the first and second layers may have a thickness ($\lambda/4$) corresponding to a quarter of the wavelength ($\lambda$) of light that is incident on the DBR structure after penetrating the inter-device dielectric layer 230 from the upper side of the inter-device dielectric layer 230.

Figure 6:
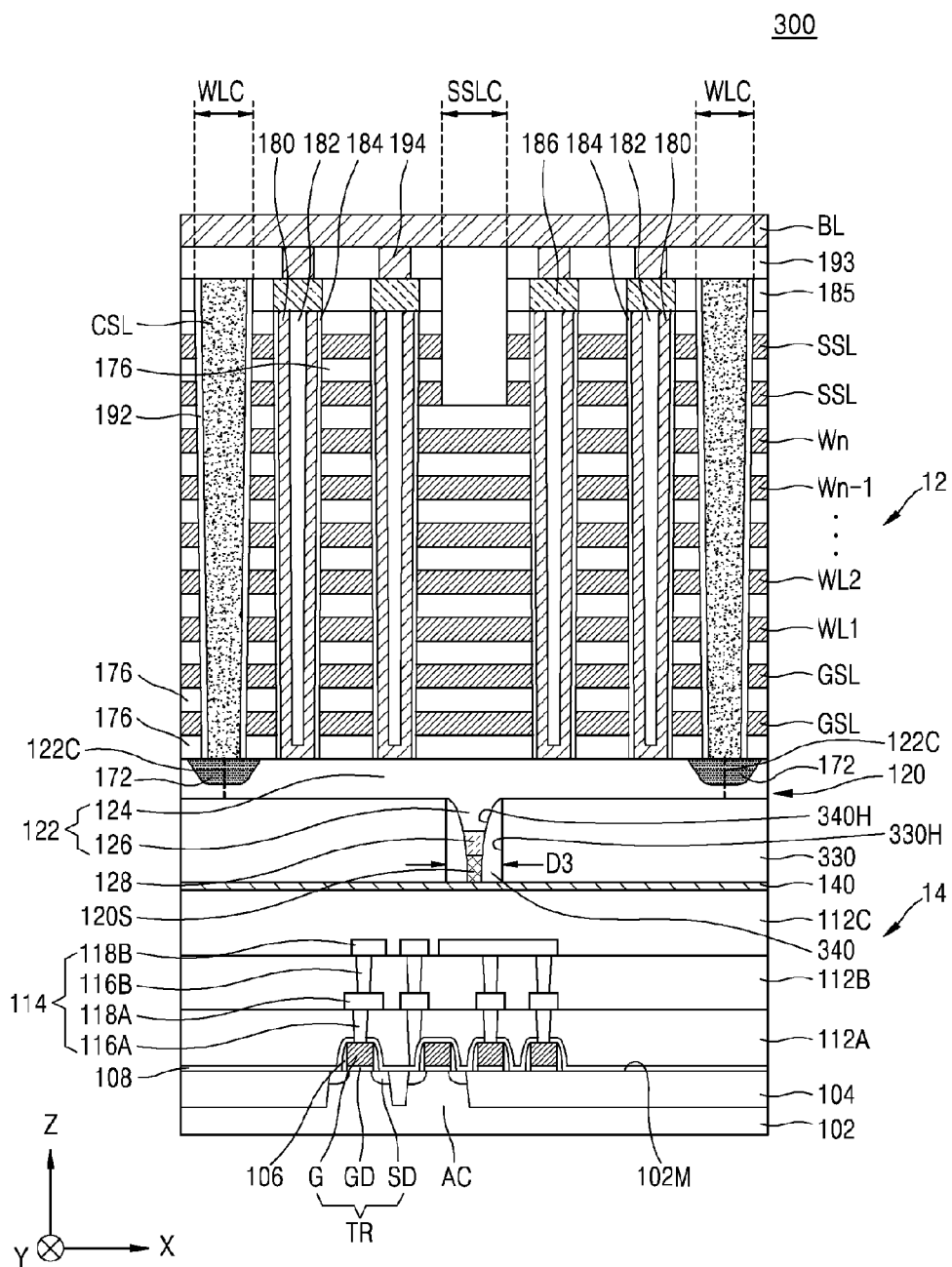
FIG. 6 is a schematic cross-sectional view illustrating a main structure of an IC device according to another exemplary embodiment of the inventive concept.

FIG. 6 is a schematic cross-sectional view illustrating a main structure of an IC device 300 according to another exemplary embodiment of the inventive concept.

The IC device 300 illustrated in FIG. 6 has substantially the same structure as the IC device 100 illustrated in FIGS. 2A through 2C, except that the IC device 300 includes an inter-device dielectric layer 330 with a hole 330H having a relatively large diameter (e.g., compared to that of FIGS. 2A through 2C) and further includes an insulating spacer 340, which surrounds a pin-shaped protruding portion 126 of a silicon single crystal 122, in the hole 330H.

Referring to FIG. 6, the inter-device dielectric layer 330 is formed between a first peripheral circuit region 14 and a polycrystalline silicon thin film 120. A hole 330H accommodating a pin-shaped protruding portion 126 of a silicon single crystal 122 is formed in the inter-device dielectric layer 330. A diameter D3 around the bottom of the hole 330H may be larger than a diameter D1 around the bottom of the pinhole 130H illustrated in FIG. 2c. Further, in one embodiment, a diameter of the hole 330H is larger than an outer diameter of the pin-shaped protruding portion 126 of the silicon single crystal 122 along the entire length of the hole 330H. An insulating spacer 340 is interposed between an inner wall of the hole 330H and the pin-shaped protruding portion 126.

In the hole 330H, a pinhole 340H having a width that is smaller than that of the hole 330H may be defined by the insulating spacer 340. The closer the pinhole 340H is to a flat portion 124 of the silicon single crystal 122 from a lower side end of the pin-shaped protruding portion 126, the larger the width of the pinhole 340H in the X direction may be.

Figure 7A:
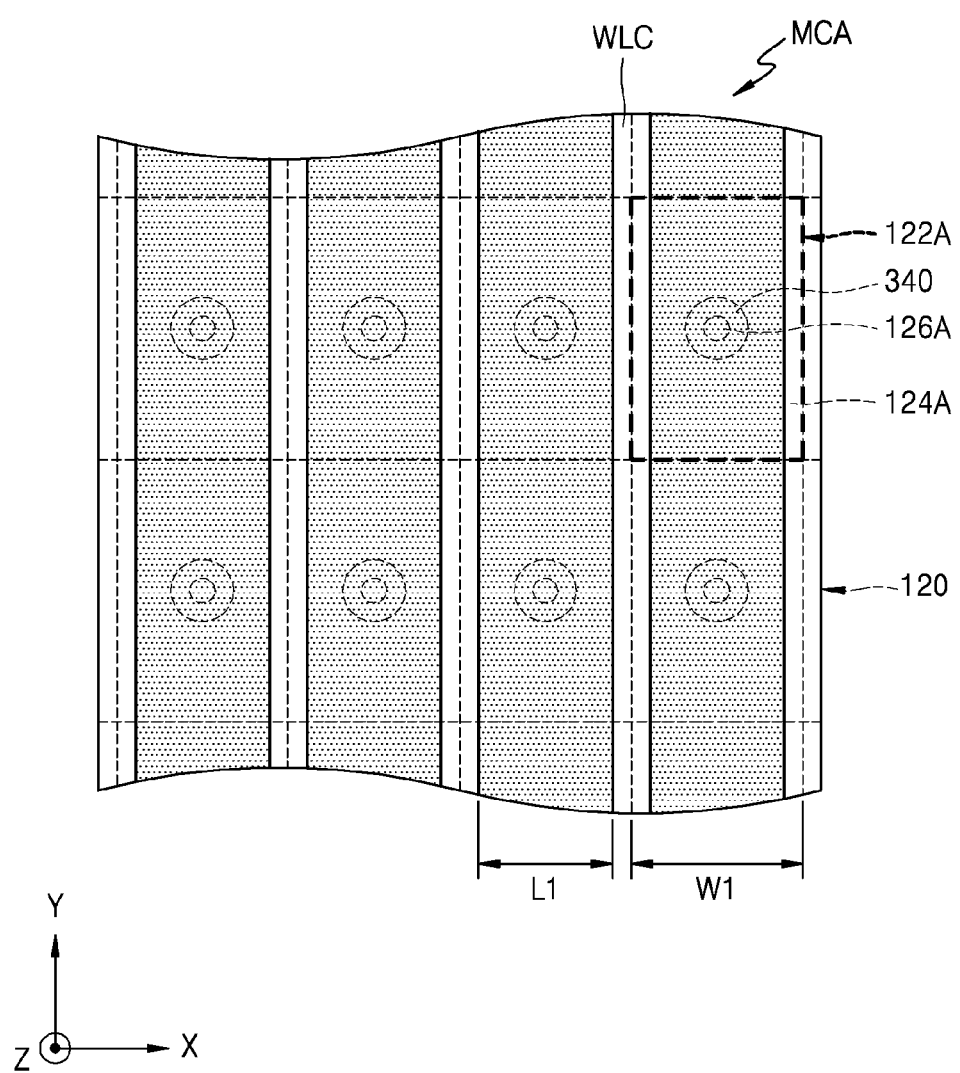
FIGS. 7A and 7B are layout diagrams of some main elements that are applicable to an IC device according to an exemplary embodiment of the inventive concept.
Figure 7B:
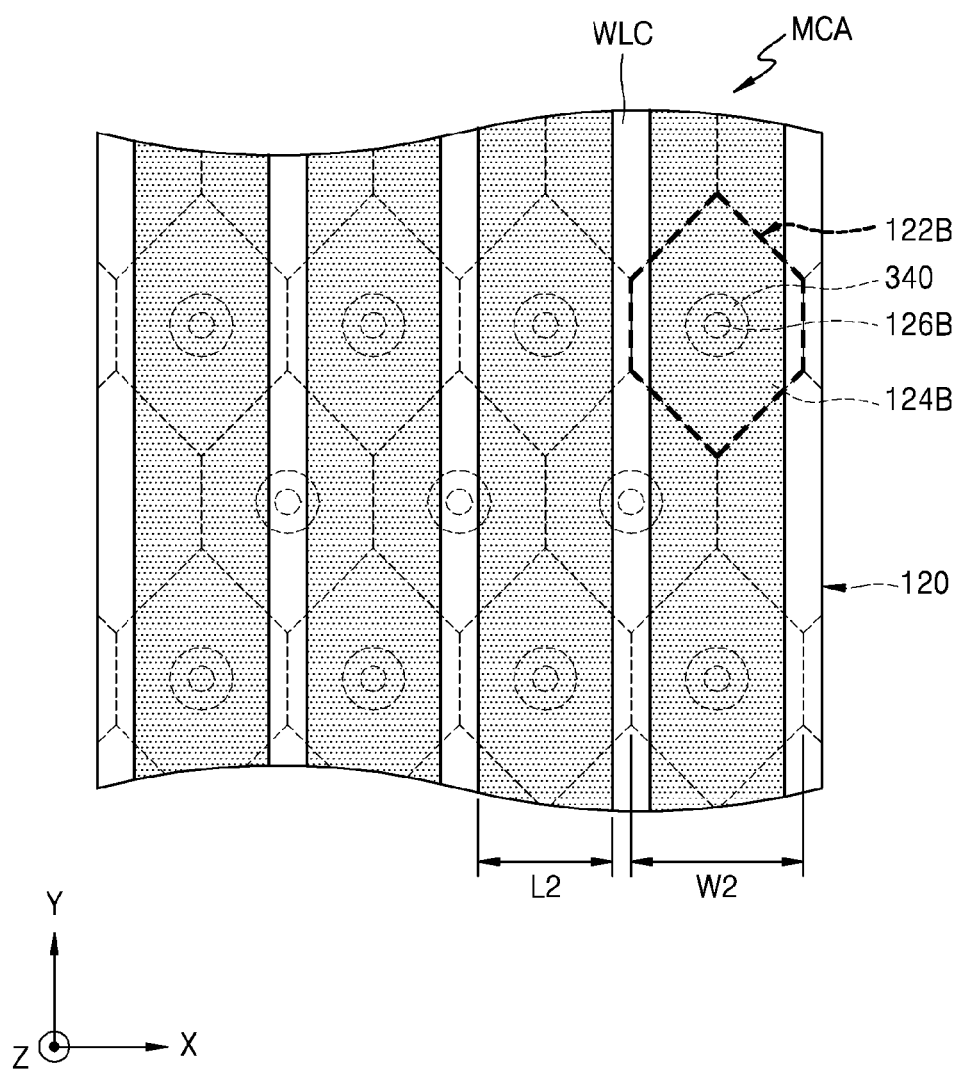

FIGS. 7A and 7B are layout diagrams of some main elements that are applicable to the IC device 300 illustrated in FIG. 6. Various planar shapes of the silicon single crystals 122A and 122B of the polycrystalline silicon thin film 120 illustrated in FIG. 6 are illustrated in FIGS. 7A and 7B.

In FIGS. 7A and 7B, the polycrystalline silicon thin film 120 may include a plurality of silicon single crystals 122A and 122B that have various planar shapes and are regularly arranged. In FIG. 7A, a flat portion 124A, a pin-shaped protruding portion 126A, and an insulating spacer 340 of each of the plurality of silicon single crystals 122A are indicated by a dotted line. In FIG. 7B, a flat portion 124B, a pin-shaped protruding portion 126B, and an insulating spacer 340 of each of the plurality of silicon single crystals 122B are indicated by a dotted line.

The structure illustrated in FIG. 7A is substantially the same as the structure illustrated in FIG. 4A, except that an insulating spacer 340 is disposed around the pin-shaped protruding portion 126A to define a space that is occupied by the pin-shaped protruding portion 126A in the hole 330H. The structure illustrated in FIG. 7B is substantially the same as the structure illustrated in FIG. 4B, except that an insulating spacer 340 is disposed around the pin-shaped protruding portion 126B to define a space that is occupied by the pin-shaped protruding portion 126B in the hole 330H.

Figure 8:
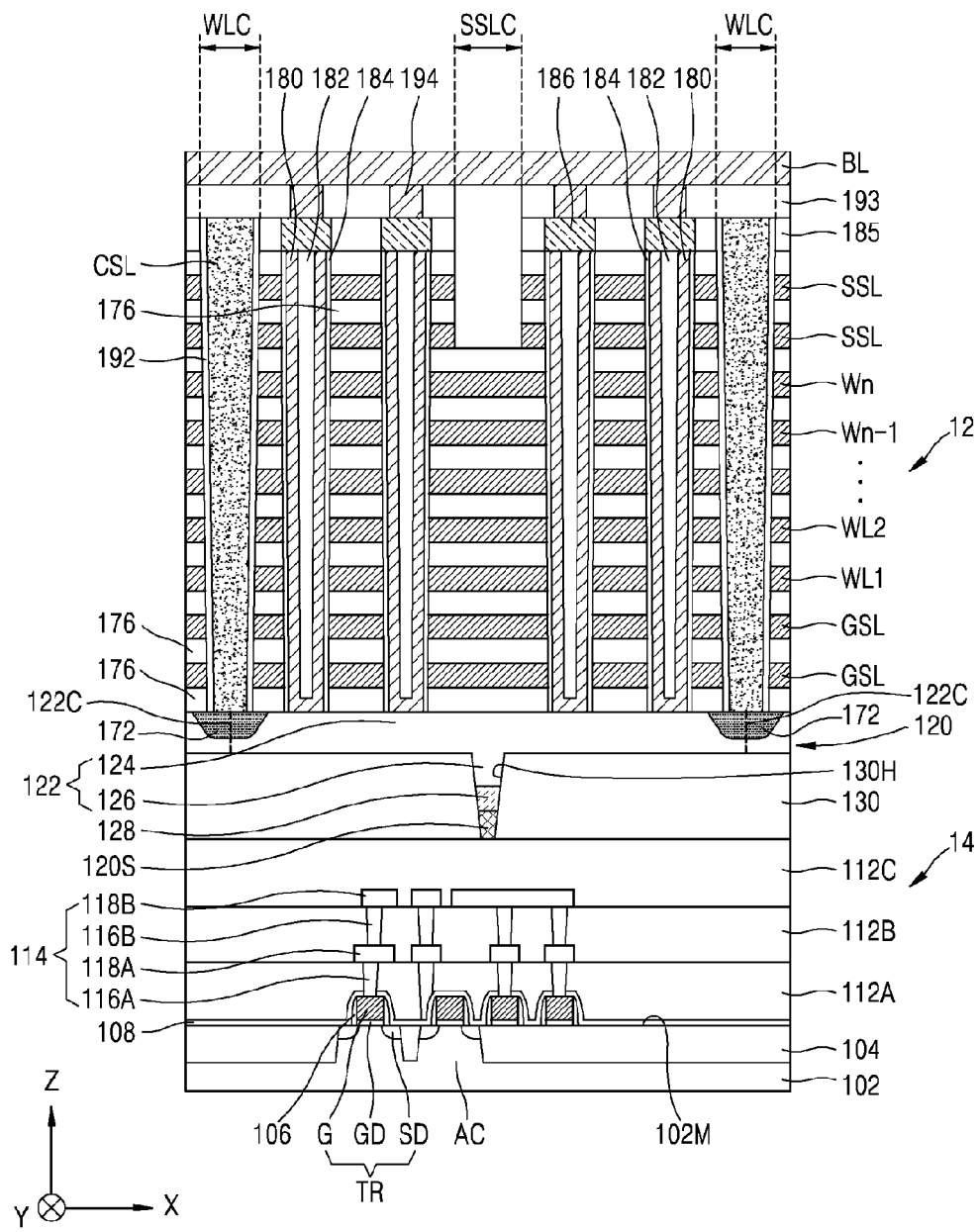
FIG. 8 is a schematic cross-sectional view illustrating a main structure of an IC device according to another exemplary embodiment of the inventive concept.

FIG. 8 is a schematic cross-sectional view illustrating a main structure of an IC device 400 according to another exemplary embodiment of the inventive concept.

The IC device 400 illustrated in FIG. 8 has substantially the same structure as the IC device 100 illustrated in FIGS. 2A through 2C, except that an insulating thin film 140 (refer to FIGS. 2A and 2C) between an uppermost interlayer insulating layer 112C and an inter-device dielectric layer 130 in a first peripheral circuit region 14 is omitted.

In the IC device 400, the uppermost interlayer insulating layer 112C may contact the inter-device dielectric layer 130. A pinhole 130H formed in the inter-device dielectric layer 130 may extend in the Z direction to completely penetrate the inter-device insulating layer 130. An upper surface of the uppermost interlayer insulating layer 112C in the first peripheral circuit region 14 may be exposed at the bottom of the pinhole 130H, and an amorphous silicon seed 120S placed around the bottom of an internal space of the pinhole 130H may contact the exposed upper surface of the uppermost interlayer insulating layer 112C.

Figure 9:
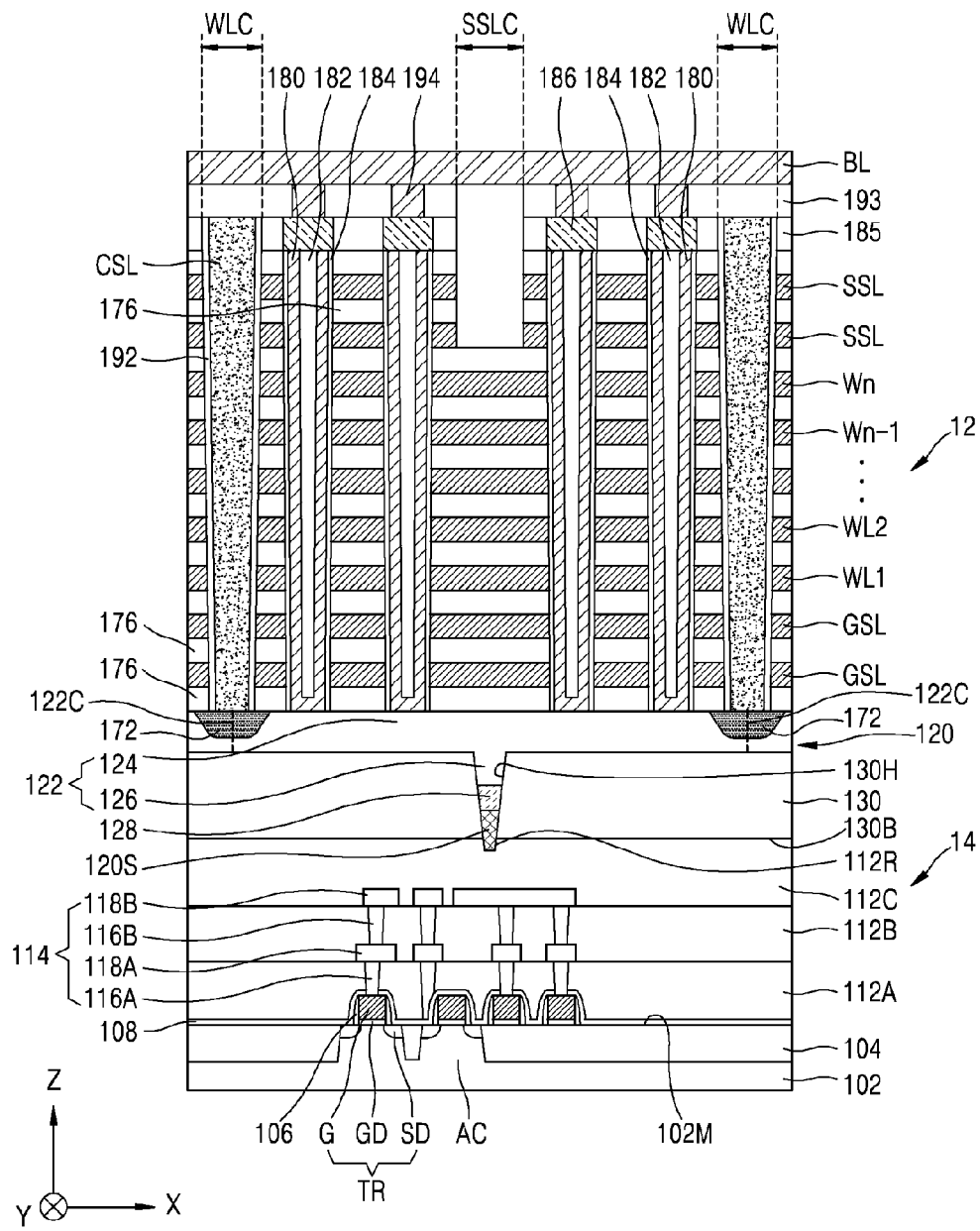
FIG. 9 is a schematic cross-sectional view illustrating a main structure of an IC device according to another exemplary embodiment of the inventive concept.

FIG. 9 is a schematic cross-sectional view illustrating a main structure of an IC device 500 according to another exemplary embodiment of the inventive concept.

The IC device 500 illustrated in FIG. 9 has substantially the same structure as the IC device 100 illustrated in FIGS. 2A through 2C, except that an insulation thin film 140 (refer to FIGS. 2A and 2C) between an uppermost interlayer insulating layer 112C and an inter-device dielectric layer 130 in a first peripheral circuit region 14 is omitted, a recess 112R communicating with a pinhole 130H is formed in an upper surface of the uppermost interlayer insulating layer 112C, and an amorphous silicon seed 120S is disposed at least in part in the recess 112R.

In the IC device 500, the uppermost interlayer insulating layer 112C may contact the inter-device dielectric layer 130. The pinhole 130H formed in the inter-device dielectric layer 130 may extend in the Z direction to completely penetrate the inter-device insulating layer 130 and thus may communicate with the recess 112R formed in the upper surface of the uppermost interlayer insulating layer 112C. At least a portion of the amorphous silicon seed 120S may extend from a lower side tip of a pin-shaped protruding portion 126 toward the substrate 102 so as to be disposed more closely to the substrate 102 than to the bottom 130B of the inter-device insulating layer 130. A surface of the amorphous silicon seed 120S which faces the substrate 102 may contact the uppermost interlayer insulating layer 112C.

Figure 10:
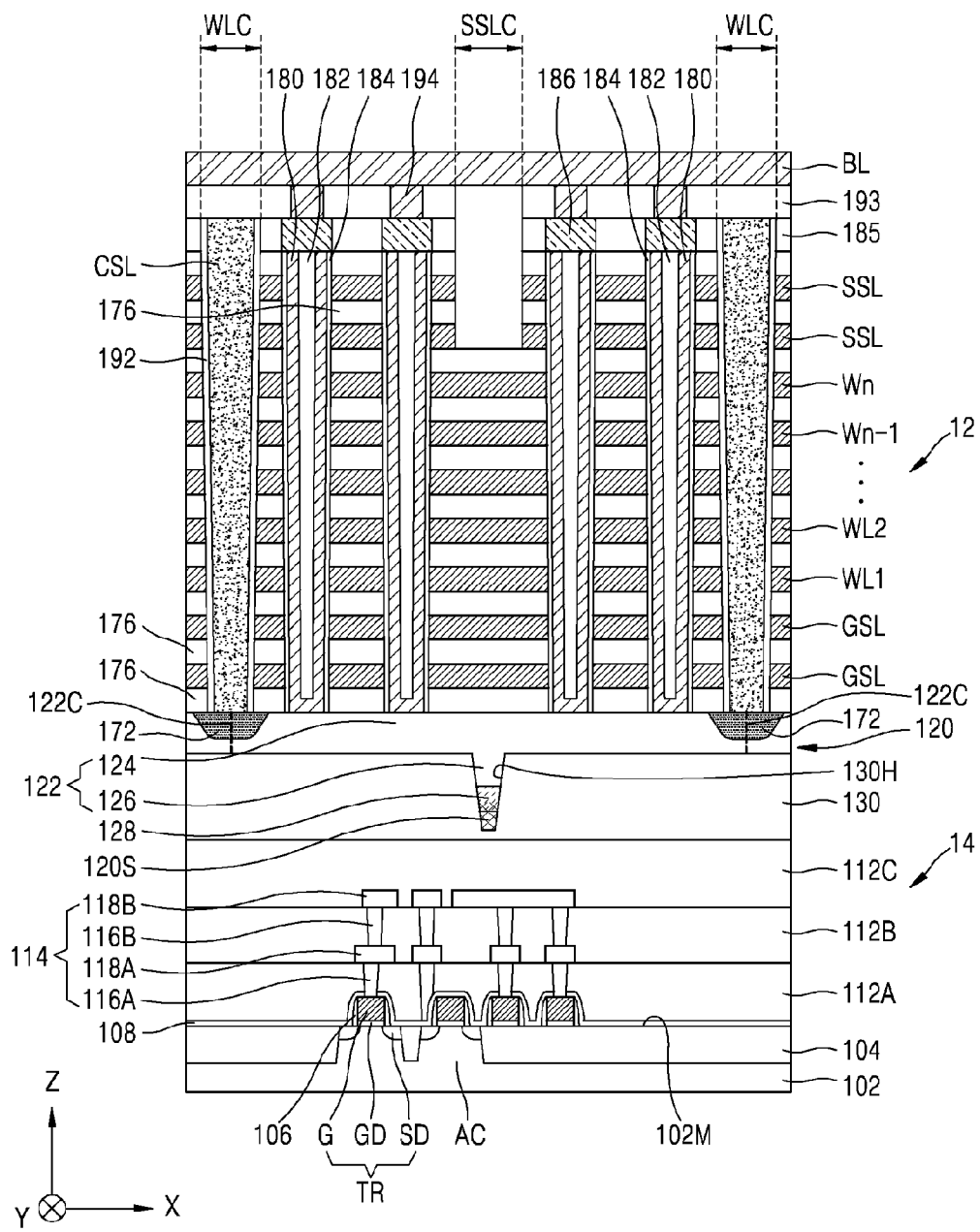
FIG. 10 is a schematic cross-sectional view illustrating a main structure of an IC device according to another exemplary embodiment of the inventive concept.

FIG. 10 is a schematic cross-sectional view illustrating a main structure of an IC device 600 according to another exemplary embodiment of the inventive concept.

The IC device 600 illustrated in FIG. 10 has substantially the same structure as the IC device 100 illustrated in FIGS. 2A through 2C, except that an insulation thin film 140 (refer to FIGS. 2A and 2C) between an uppermost interlayer insulating layer 112C and an inter-device dielectric layer 130 in a first peripheral circuit region 14 is omitted, and a pinhole 130H formed in the inter-device dielectric layer 130 extends, in the Z direction, in the form of a blind hole penetrating only a portion of the inter-device dielectric layer 130.

In the IC device 600, the uppermost interlayer insulating layer 112C may contact the inter-device dielectric layer 130. An amorphous silicon seed 120S is separate from the uppermost interlayer insulating layer 112C with the inter-device dielectric layer 130 interposed therebetween. A surface of the amorphous silicon seed 120S which faces the substrate 102 may contact the inter-device dielectric layer 130.

Figure 11:
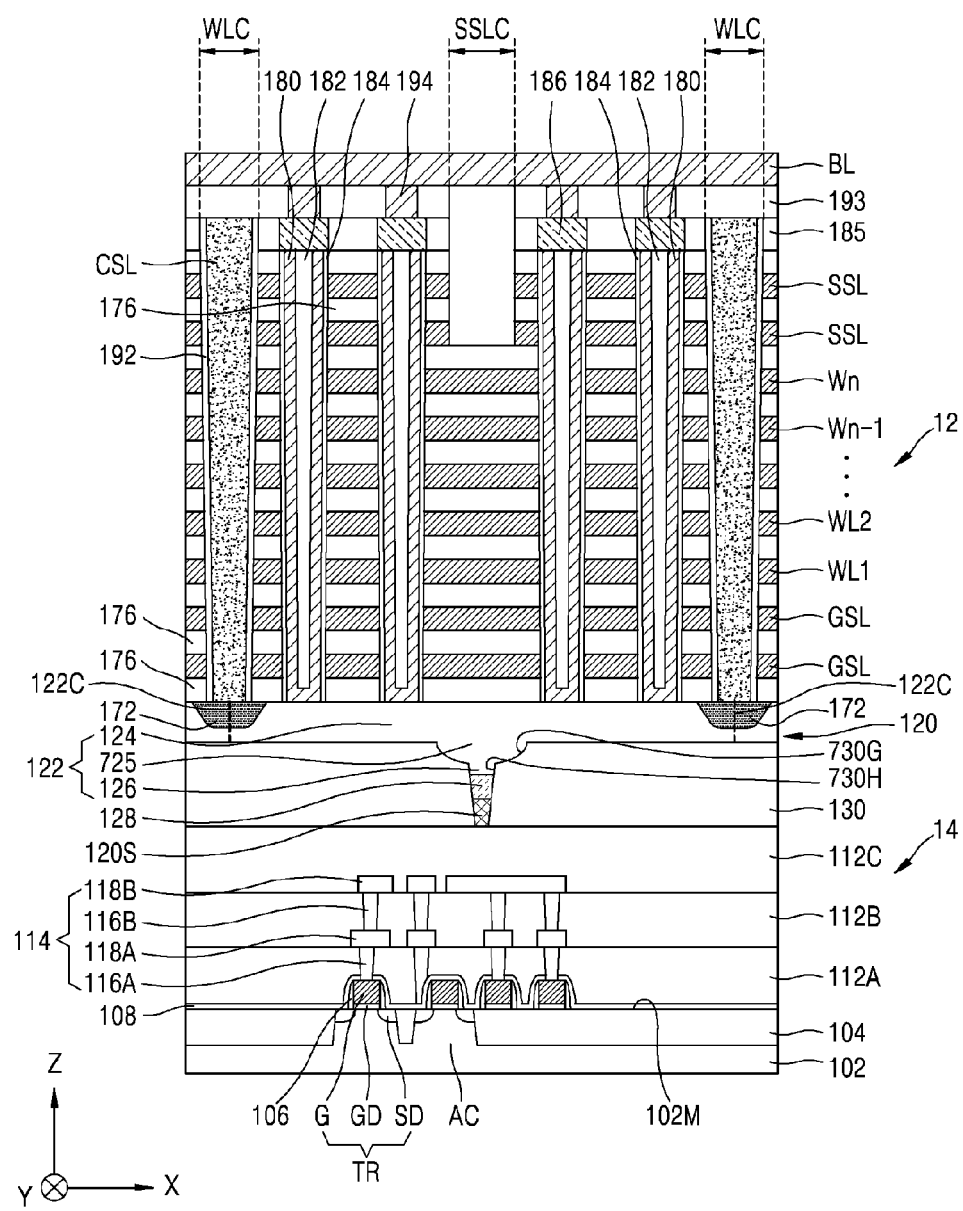
FIG. 11 is a schematic cross-sectional view illustrating a main structure of an IC device according to another exemplary embodiment of the inventive concept.

FIG. 11 is a schematic cross-sectional view illustrating a main structure of an IC device 700 according to another exemplary embodiment of the inventive concept.

The IC device 700 illustrated in FIG. 11 has substantially the same structure as the IC device 100 illustrated in FIGS. 2A through 2C, except that an insulation thin film 140 (refer to FIGS. 2A and 2C) between an uppermost interlayer insulating layer 112C and an inter-device dielectric layer 130 in a first peripheral circuit region 14 is omitted and a silicon single crystal 122 includes an intermediate connection portion 725 formed in one body together with a flat portion 124 and a pin-shaped protruding portion 126. The intermediate connection portion 725 is disposed between the flat portion 124 and the pin-shaped protruding portion 126. Together, the intermediate connection portion 725 and the pin-shaped protruding portion 126 may be described as a protruding portion that vertically protrudes from the flat portion 124. In a direction that is parallel to a main surface 102M of a substrate 102, the width of the intermediate connection portion 725 is larger than that of the pin-shaped protruding portion 126.

In the IC device 700, the uppermost interlayer insulating layer 112C may contact the inter-device dielectric layer 130. A hole (e.g., pinhole) 730H and a groove 730G that communicates with the pinhole 730H and has an inner diameter which is larger than that of the pinhole 730H are formed in the inter-device dielectric layer 130. The intermediate connection portion 725 may be formed to fill the groove 730G.

A space that is prepared by the pinhole 730H and the groove 730G may extend in the Z direction (e.g., vertical direction) to completely penetrate the inter-device dielectric layer 130. An upper surface of the uppermost interlayer insulating layer 112C in the first peripheral circuit region 14 may be exposed at the bottom of the pinhole 730H, and an amorphous silicon seed 120S placed around the bottom of an internal space of the pinhole 730H may contact the exposed upper surface of the uppermost interlayer insulating layer 112C.

In some exemplary embodiments, the IC device 700 may further include an insulating thin film 140 formed between the uppermost interlayer insulating layer 112C and the inter-device dielectric layer 130, similar to the IC device 100 illustrated in FIGS. 2A and 2C. In this case, a surface of the amorphous silicon seed 120S which faces the substrate 102 may contact the insulating thin film 140.

In some other exemplary embodiments, the pinhole 730H formed in the inter-device dielectric layer 130 may extend in the Z direction to completely penetrate the inter-device insulating layer 130, similar to the pinhole 130H in the IC device 500 illustrated in FIG. 9, and thus may communicate with a recess 112R formed in the upper surface of the uppermost interlayer insulating layer 112C. At least a portion of the amorphous silicon seed 120S may be formed in the recess 112R of the uppermost interlayer insulating layer 112C.

In some other exemplary embodiments, the pinhole 730H formed in the inter-device dielectric layer 130 may extend, in the Z direction, in the form of a blind hole penetrating only a portion of the inter-device dielectric layer 130, similar to the pinhole 130H in the IC device 600 illustrated in FIG. 10. The amorphous silicon seed 120S may be separate from the uppermost interlayer insulating layer 112C with the inter-device dielectric layer 130 interposed therebetween, and a surface of the amorphous silicon seed 120S which faces the substrate 102 may contact the inter-device dielectric layer 130.

In the IC device 700 illustrated in FIG. 11, the groove 730G having an inner diameter that is larger than that of the pinhole 730H is formed in the inter-device dielectric layer 130, as described above. Thus, when performing a deposition process for forming an amorphous silicon layer 120H in the groove 730G and the pinhole 730H in a process to be explained with reference to FIG. 15E, the formation of voids in the groove 730G and the pinhole 730H may be effectively suppressed.

Figure 12A:
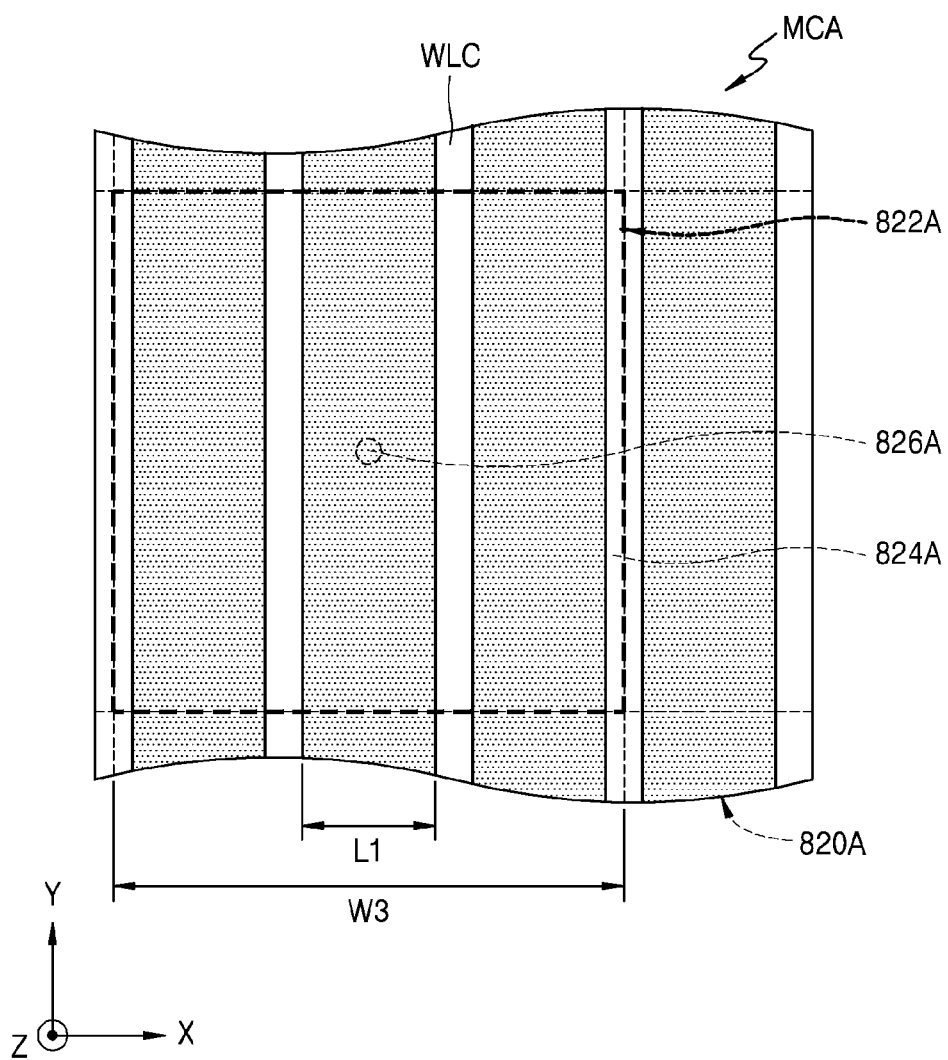
FIGS. 12A and 12B are layout diagrams of some main elements that are applicable to modification examples of an IC device according to an exemplary embodiment of the inventive concept.
Figure 12B:
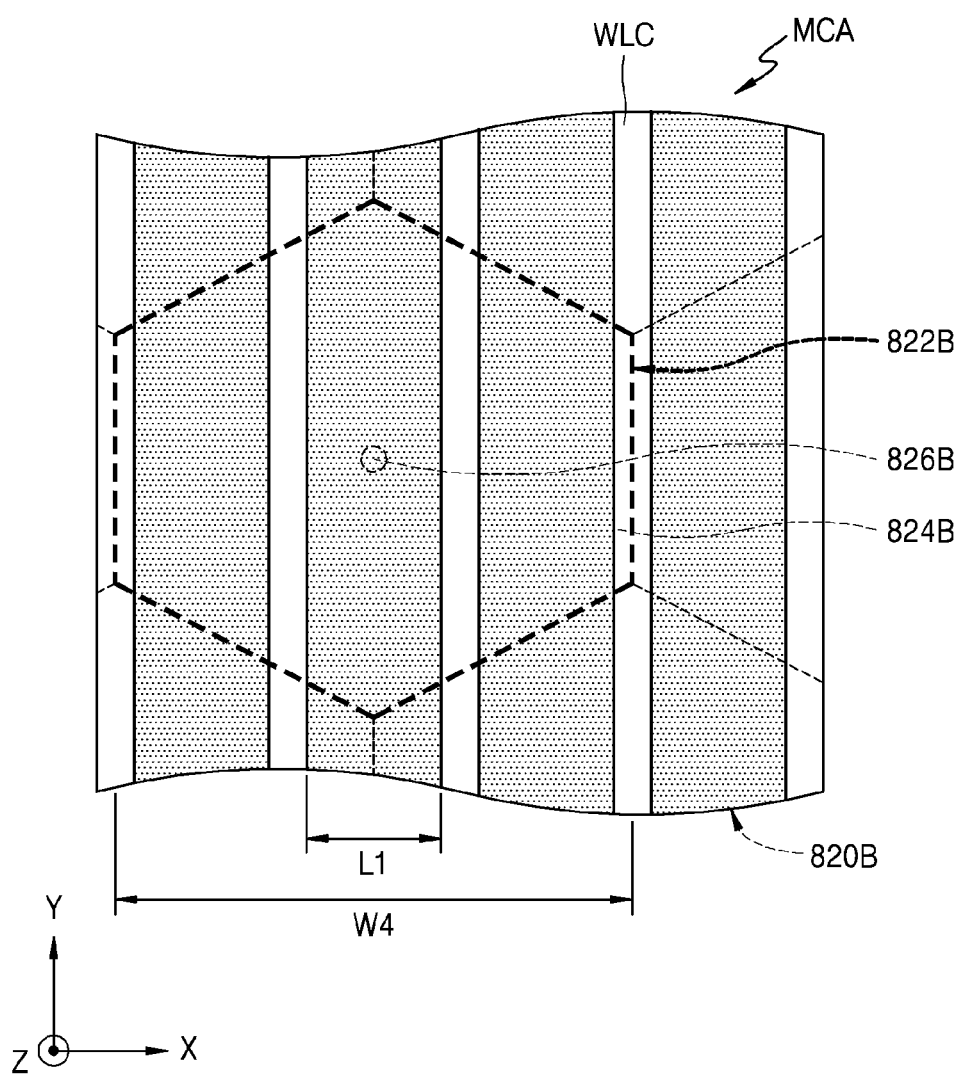

FIGS. 12A and 12B are layout diagrams of some main elements that are applicable to modification examples of the IC devices 100, 200, 300, 400, 500, 600, and 700 according to the above-described exemplary embodiments.

In FIGS. 12A and 12B, polycrystalline silicon thin films 820A and 820B have similar structures to the polycrystalline silicon thin film 120 included in the IC device 100 illustrated in FIGS. 2A through 2C. The polycrystalline silicon thin films 820A and 820B may include silicon single crystals 822A and 822B having relatively large widths W3 and W4, respectively, so that the polycrystalline silicon thin films 820A and 820B each vertically overlap at least three word line cut regions WLC (e.g., at least two entire word line cut regions WLC, or at least three word lines). FIGS. 12A and 12B illustrate cases in which the polycrystalline silicon thin films 820A and 820B include silicon single crystals 822A and 822B, respectively, which vertically overlap four word line cut regions WLC in the X direction. However, the sizes and shapes of the silicon single crystals 822A and 822B are not limited to those illustrated in FIGS. 12A and 12B and may be variously modified and changed.

The polycrystalline silicon thin film 820A may include a plurality of silicon single crystals 822A that have various planar shapes and are regularly arranged. In FIG. 12A, a flat portion 824A and a pin-shaped protruding portion 826A of each of the plurality of silicon single crystals 822A are indicated by a dotted line. Similarly, the polycrystalline silicon thin film 820B may include a plurality of silicon single crystals 822B that have various planar shapes and are regularly arranged. In FIG. 12B, a flat portion 824B and a pin-shaped protruding portion 826B of each of the plurality of silicon single crystals 822B are indicated by a dotted line.

In some exemplary embodiments, as illustrated in FIG. 12A, the polycrystalline silicon thin film 820A may include a plurality of silicon single crystals 822A arranged in a matrix form. Each of the plurality of silicon single crystals 822A includes a pin-shaped protruding portion 826A, and the plurality of pin-shaped protruding portions 826A of the plurality of silicon single crystal 822A may also be arranged in a matrix form. A plurality of flat portions 824A connected to the plurality of pin-shaped protruding portions 826A may have substantially quadrangular planar shapes and be regularly arranged in a matrix form. In some exemplary embodiments, each of the plurality of flat portions 824A may have a quadrangular planar shape whose corner is round-shaped.

A memory cell array MCA may be formed on the plurality of silicon single crystals 822A by using the polycrystalline silicon thin film 820A, which includes the plurality of silicon single crystals 822A, as an active region. A plurality of memory cell strings MS (refer to FIG. 3) may be disposed on a flat portion 824A of any one of the plurality of silicon single crystals 822A.

In some other exemplary embodiments, as illustrated in FIG. 12B, the polycrystalline silicon thin film 820B may include a plurality of silicon single crystals 822B arranged to form a honeycomb structure. A plurality of pin-shaped protruding portions 826B of the plurality of silicon single crystal 122B may also be arranged to form a honeycomb structure. A plurality of flat portions 824B connected to the plurality of pin-shaped protruding portions 826B may have substantially hexagonal planar shapes and be arranged to form a honeycomb structure. In some exemplary embodiments, each of the plurality of flat portions 824B may have a hexagonal planar shape whose corner is round-shaped.

A memory cell array MCA may be formed on the plurality of silicon single crystals 822B by using the polycrystalline silicon thin film 820B, which includes the plurality of silicon single crystals 822B, as an active region. A plurality of memory cell strings MS (refer to FIG. 3) may be disposed on a flat portion 824B of any one of the plurality of silicon single crystals 822B.

FIGS. 13A through 13K are cross-sectional views that sequentially illustrate a method of manufacturing an IC device, according to an exemplary embodiment of the inventive concept. In the current exemplary embodiment, a method of manufacturing the IC device 100 illustrated in FIGS. 2A through 2C is described as an example.

Figure 13A:
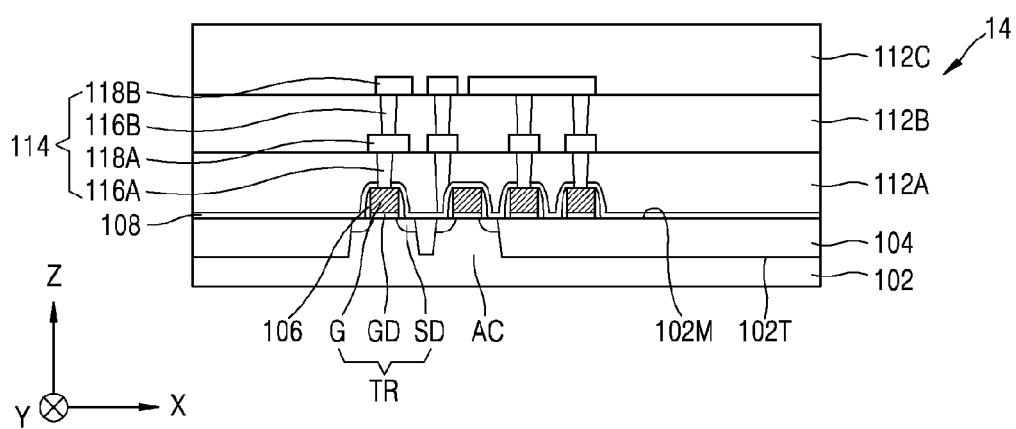
FIGS. 13A through 13K are cross-sectional views that sequentially illustrate a method of manufacturing an IC device, according to an exemplary embodiment of the inventive concept.

Referring to FIG. 13A, a first peripheral circuit region 14 is formed in a partial region on a substrate 102.

More specifically, a trench 102T is formed in the substrate 102, and the inside of the trench 102T is filled with an insulating material such as silicon oxide to thereby form a device isolation layer 104 defining an active region AC. Subsequently, a p-well for peripheral circuits and an n-well for peripheral circuits may be formed by performing a plurality of ion implantation processes on the substrate 102. The p-well may be a region in which NMOS transistors are formed, and the n-well may be a region in which PMOS transistors are formed.

A gate insulating layer DG for peripheral circuits is formed on the substrate 102. Subsequently, a gate G for peripheral circuits is formed on the gate insulating layer GD. The gate G may be formed, for example, of doped polysilicon, metal, or a combination thereof. An insulating spacer 106 is formed on a sidewall of the gate G, and a source/drain region SD is formed in the substrate 102 at both sides of the gate G. A source/drain region SD for NMOS transistor formation may be formed by implanting n-type impurities into the substrate 102. A source/drain region SD for PMOS transistor formation may be formed by implanting p-type impurities into the substrate 102. The source/drain region SD may have a lightly doped drain (LDD) structure. Accordingly, a plurality of transistors TR, each of which includes the gate insulating layer DG, the gate G, and the source/drain region SD, may be formed.

An etch stop layer 108 is formed on the plurality of transistors TR and the insulating spacer 106. The etch stop layer 108 may include an insulation material that is formed, for example, of silicon nitride, silicon oxynitride, or a combination thereof.

A multi-layer wiring structure 114, which includes a first contact 116A, a first wiring layer 118A, a second contact 116B, and a second wiring layer 118B, and a plurality of interlayer insulating layers 112A, 112B, and 112C, which may insulate the multi-layer wiring structure 114, are formed on the etch stop layer 108. The second wiring layer 118B of the multi-layer wiring structure 114 may be the uppermost wiring layer.

While the first peripheral circuit region 14 is formed in the partial region on the substrate 102 as described above, at least a portion of a second peripheral circuit region 16 described with reference to FIG. 1 may be simultaneously formed in another partial region on the substrate 102.

Figure 13B:
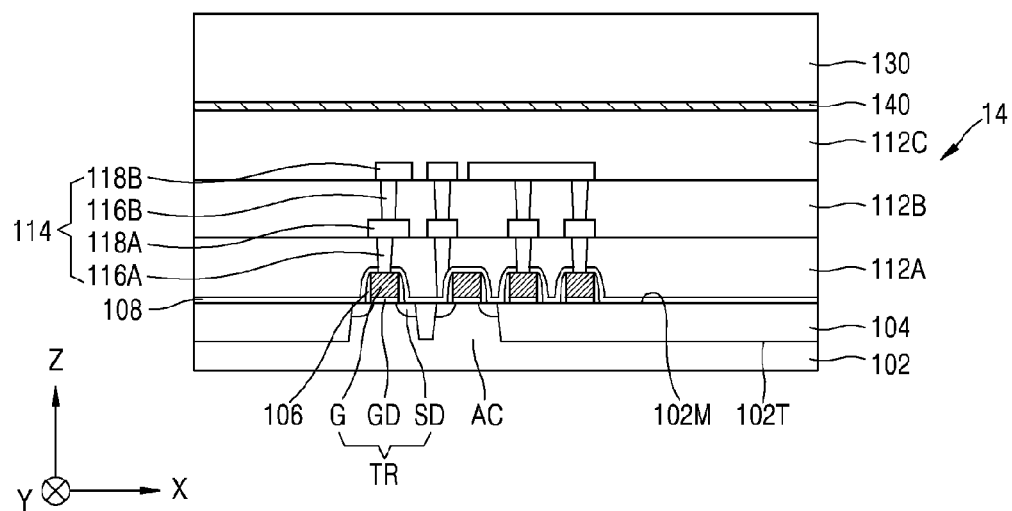

Referring to FIG. 13B, an insulating thin film 140 and an inter-device dielectric layer 130 are sequentially formed on the interlayer insulating layer 112C covering the second wiring layer 118B that is the uppermost wiring layer of the multi-layer wiring structure 114.

The insulating thin film 140 and the inter-device dielectric layer 130 may be formed of different materials to provide different etch selectivities. In some exemplary embodiments, the insulation thin film 140 may be formed of silicon nitride, and the inter-device dielectric layer 130 may be formed of silicon oxide. In some other exemplary embodiments, the inter-device dielectric layer 130 may include a reflective mirror layer as described with respect to the inter-device dielectric layer 230 with reference to FIG. 5. As described with reference to FIG. 5, the reflective mirror layer may include an insulating structure in which a first insulating thin film 232 having a first reflective index and a second insulating thin film 234 having a second reflective index that is lower than the first reflective index are alternately stacked at least one time.

The thickness of the insulation thin film 140 and the thickness of the inter-device dielectric layer 130 may be variously determined according to a design of the IC device. In some exemplary embodiments, the thickness of the insulation thin film 140 and the thickness of the inter-device dielectric layer 130 may be determined so that a vertical distance from an upper surface of the substrate 120 to an upper surface of the inter-device dielectric layer 130 in the Z direction is from about 1.5 µm to about 2.0 µm. In some other exemplary embodiments, the thickness of the insulation thin film 140 and the thickness of the inter-device dielectric layer 130 may be determined so that a vertical distance from the second wiring layer 118B, which is the uppermost wiring layer of the multi-layer wiring structure 114, to the upper surface of the inter-device dielectric layer 130 in the Z direction is from about 500 nm to about 1 µm.

In some exemplary embodiments, a process of forming the insulating thin film 140 may be omitted. When the process of forming the insulating thin film 140 is omitted, any one of the IC devices 400, 500, 600, and 700 illustrated in FIGS. 8 through 11 may be obtained according to subsequent processes.

Figure 13C:
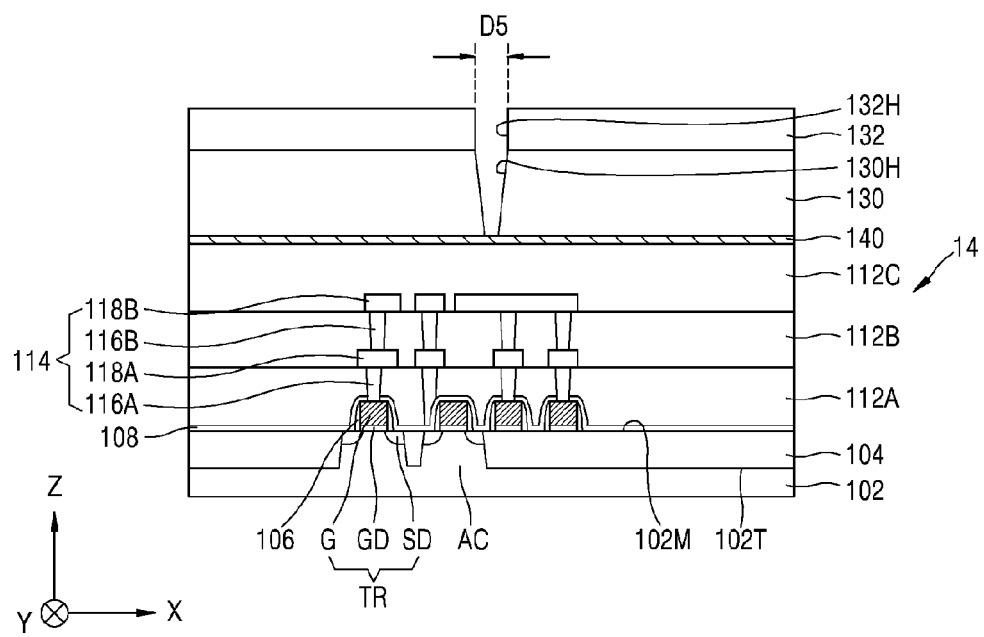

Referring to FIG. 13C, a mask pattern 132, in which at least one opening 132H has been formed to expose the inter-device dielectric layer 130, is formed on the inter-device dielectric layer 130, and at least one vertical hole (e.g., pinhole) 130H is formed in the inter-device dielectric layer 130 by etching the inter-device dielectric layer 130 by using the mask pattern 132 as an etch mask and using the insulating thin film 140 as an etch stop layer.

In some exemplary embodiments, the at least one pinhole 130H that is formed in the inter-device dielectric layer 130 may include a plurality of pinholes 130H formed in a position corresponding to any one of arrangement structures of the pin-shaped protruding portions 126A, 126B, 826A, and 826B illustrated in FIGS. 4A, 4B, 12A, and 12B.

In certain embodiments, the at least one pinhole 130H may be formed to have an inner diameter D5 of about 100 nm or less at the inlet thereof. For example, the at least one pinhole 130H may have the inner diameter D5 of about 60 nm to about 100 nm (e.g., in one embodiment, about 60 nm near the bottom and about 100 nm near the inlet). When the inner diameter D5 of the at least one pinhole 130H is too small, a void may be formed in the pinhole 130H during a deposition process for the formation of an amorphous silicon layer 120A to be explained with reference to FIG. 13D. When the inner diameter D5 of the at least one pinhole 130H is too large, an effective grain filter effect may not be expected in a solidification process to be explained with reference to FIG. 13F. Accordingly, it is useful to form the pinhole 130H having a diameter of an appropriate size according to a design of the IC device.

Figure 13D:
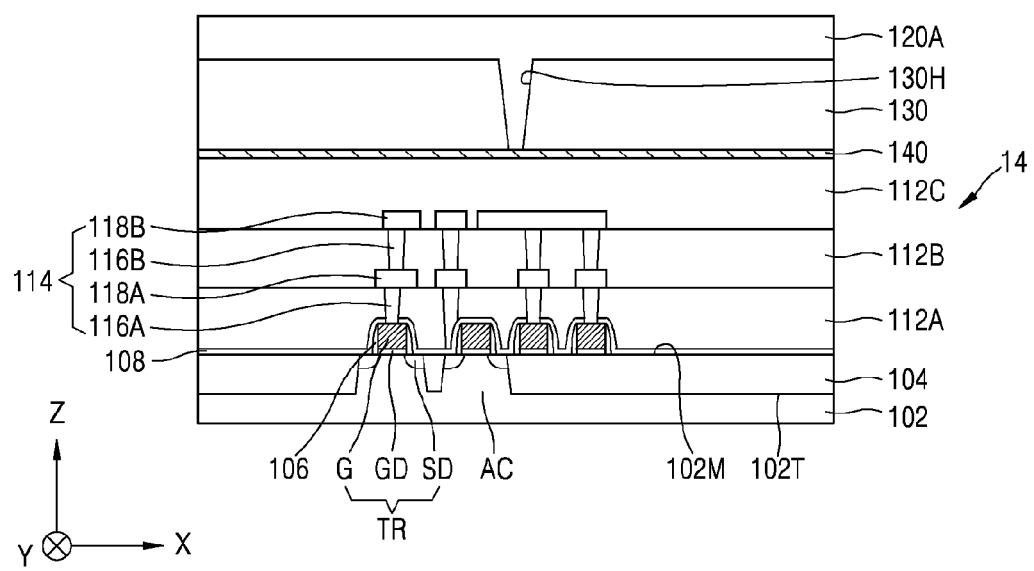
Figure 13E:
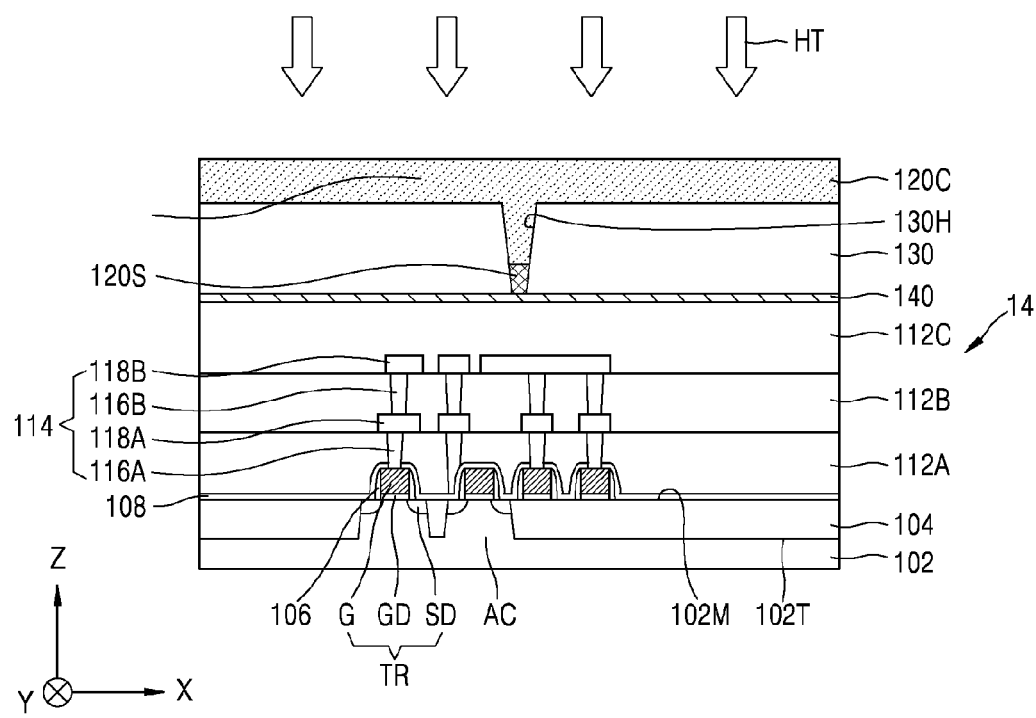
Figure 13F:
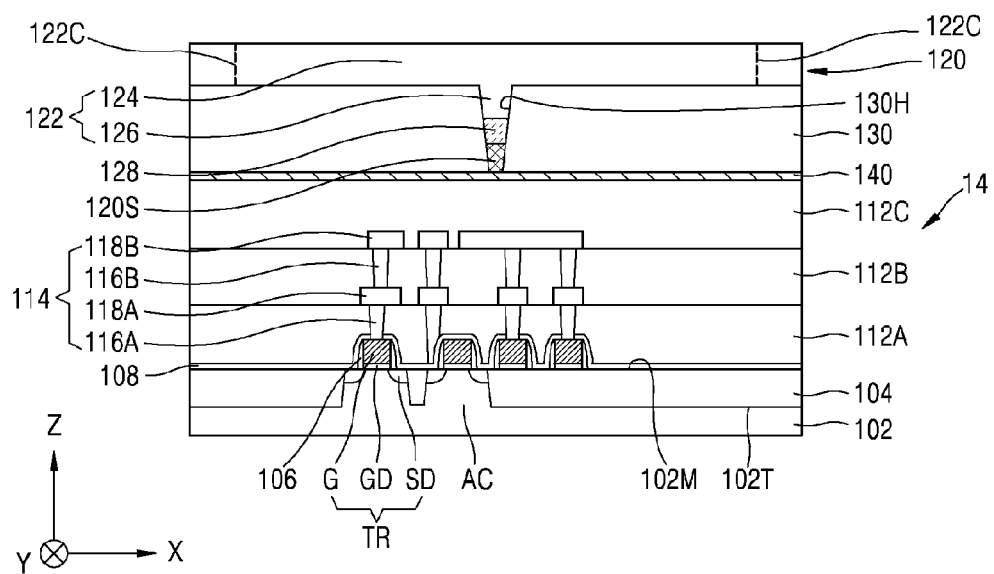

When the at least one pinhole 130H includes a plurality of pinholes, an interval between the plurality of pinholes may be determined in consideration of a particle size of a silicon single crystal 122 to be formed in the process of FIG. 13F. For example, the interval between the plurality of pinholes may be equal to or smaller than widths in the X direction of a plurality of silicon single crystals to be formed in subsequent processes, for example, the plurality of silicon single crystals 122A, 122B, 822A, and 822B illustrated in FIGS. 4A, 4B, 12A, and 12B. The arrangement of the plurality of pinholes is not limited to a specific arrangement. In some exemplary embodiments, the plurality of pinholes may be arranged in a matrix form to have regular intervals in the X direction and the Y direction, as illustrated in FIG. 4B. In this case, the silicon single crystal 122 having a flat portion 124 whose planar shape is a quadrangle may be obtained in the process of FIG. 13F. In some other exemplary embodiments, any one pinhole 130H and adjacent pinholes 130H around the pinhole 130H may be arranged in a honeycomb structure so that they are arranged at equal intervals, as illustrated in FIG. 4B. In this case, the silicon single crystal 122 having a flat portion 124 whose planar shape is a hexagon may be obtained in the process of FIG. 13F.

Referring to FIG. 13D, after exposing an upper surface of the inter-device dielectric layer 130 by removing the mask pattern 132 from a resultant structure of FIG. 13, the amorphous silicon layer 120A is formed to cover the upper surface of the inter-device dielectric layer 130 while filling the inside of the pinhole 130H formed in the inter-device dielectric layer 130.

In some exemplary embodiments, the amorphous silicon layer 120A may be formed to have a thickness of about 200 nm to about 500 nm on the inter-device dielectric layer 130, but is not limited thereto.

A low pressure chemical vapor deposition (LPCVD) process or a plasma enhanced chemical vapor deposition (PECVD) process may be used to form the amorphous silicon layer 120A.

Referring to FIG. 13E, heat HT is applied to the amorphous silicon layer 120A to perform an annealing process on the amorphous silicon layer 120A.

When the heat HT is applied to the amorphous silicon layer 120A from an upper side of the amorphous silicon layer 120A, the heat HT applied to the amorphous silicon layer 120A may be transmitted from the upper surface of the amorphous silicon layer 120A to the inside thereof and thus a portion of the amorphous silicon layer 120A may be stress-relieved or melted. Thus, the portion of the amorphous silicon layer 120A may be changed to a stress-relieved or melted silicon layer 120C.

In some exemplary embodiments, in order to anneal the amorphous silicon layer 120A, the heat HT may be applied to the amorphous silicon layer 120A by applying a laser beam to the upper surface of the amorphous silicon layer 120A for a predetermined time or performing a rapid thermal processing (RTP) on the upper surface of the amorphous silicon layer 120A for a predetermined time.

In some exemplary embodiments, an XeCl pulse excimer laser beam having a wavelength of about 308 nm and a pulse width of about 10 ns to about 30 ns, an XeCl excimer laser beam having a pulse width of about 100 ns to about 300 ns, or an Yb:YAG laser beam having a wavelength of about 515 nm and a pulse frequency of about 10 kHz may be radiated to anneal the amorphous silicon layer 120A. However, the inventive concept is not limited thereto. In the case of radiating a laser beam, the laser beam may be radiated so that energy density is about 0.4 J/cm$^2$ to about 2.0 J/cm$^2$. However, the inventive concept is not limited thereto.

When performing an annealing process on the amorphous silicon layer 120A, the heat HT may be applied to the amorphous silicon layer 120A at a predetermined temperature for a predetermined time to the extent that a portion of the amorphous silicon layer 120A around the bottom of the pinhole 130H, which is relatively distant from the upper surface of the amorphous silicon layer 120A, is not stress-relieved and remains in a solid state. After the annealing using the heat HT, a portion of the amorphous silicon layer 120A which is on the inter-device dielectric layer 130 and a portion of the amorphous silicon layer 120A which is in a region adjacent to the inlet of the pinhole 130H may exist as the stress-relieved or melted silicon layer 120C. On the other hand, a portion of the amorphous silicon layer 120A which is relatively distant from the upper surface thereof, such as a portion of the amorphous silicon layer 120A around the bottom of the pinhole 130H, may maintain a solid state and thus remain as an amorphous silicon seed 120S.

In some exemplary embodiments, the inter-device dielectric layer 130 may include a reflective mirror layer as described with respect to the inter-device insulating layer 230 with reference to FIG. 5. In this case, when a laser beam is applied to the upper surface of the amorphous silicon layer 120A, at least some of the laser beam light which reaches the inside of the amorphous silicon layer 120A after passing the upper surface of the amorphous silicon layer 120A may be reflected to the outside through the amorphous silicon layer 120A, thereby effectively suppressing the transmission of heat to a portion of the amorphous silicon layer 120A which is around the bottom of the pinhole 130H. Accordingly, the amorphous silicon seed 120S, which is an element used to solidify the stress-relieved or melted silicon layer 120C again, may remain.

Referring to FIG. 13F, when the annealing for the stress-relieved or melted silicon layer 120C is completed or the temperature of the heat HT that is applied to the stress-relieved or melted silicon layer 120C decreases, the amorphous silicon seed 120S functions as a seed for launching the solidification of the stress-relieved or melted silicon layer 120C. Accordingly, a solidification process of the stress-relieved or melted silicon layer 120C is performed from a lower portion of the pinhole 130H. In this case, the solidification of the stress-relieved or melted silicon layer 120C is launched by the amorphous silicon seed 120S while the pinhole 130H having a relatively narrow width functions as a grain-filter. Thus, in one embodiment, only grains having a highest growth rate from among solidifying grains may be selectively grown and be grown up to the outside of the pinhole 130H while being trapped at an inner wall of the pinhole 130H during the growth of the grains.

As a result, the amorphous silicon seed 120S remains around the bottom of the internal space of the pinhole 130H, and a polycrystalline silicon thin film 120 including at least one silicon single crystal 122 may be formed on the amorphous silicon seed 120S. The at least one silicon single crystal 122 includes a flat horizontal portion 124 having a grain boundary indicated by the dotted line 122C and a vertically (e.g., pin-shaped, or bump shaped) protruding portion 126 protruding from the flat portion 124 toward the first peripheral circuit region 14. In addition, in the internal space of the pinhole 130H, a polycrystalline silicon plug 128 may remain between the amorphous silicon seed 120S and the pin-shaped protruding portion 126. The polycrystalline silicon plug 128 may be formed of silicon grains having relatively small diameters. In some cases, the polycrystalline silicon plug 128 may not be formed.

In some exemplary embodiments, the polycrystalline silicon plug 128 may not exist in the pinhole 130H. In this case, in the pinhole 130h, the amorphous silicon seed 120S may contact the pin-shaped protruding portion 126 of the silicon single crystal 122.

The at least one silicon single crystal 122 of the polycrystalline silicon thin film 120 may form a plurality of silicon single crystals having any one of the structures of the plurality of silicon single crystals 122A, 122B, 822A, and 822B illustrated in FIGS. 4A, 4B, 12A, and 12B.

Figure 13G:
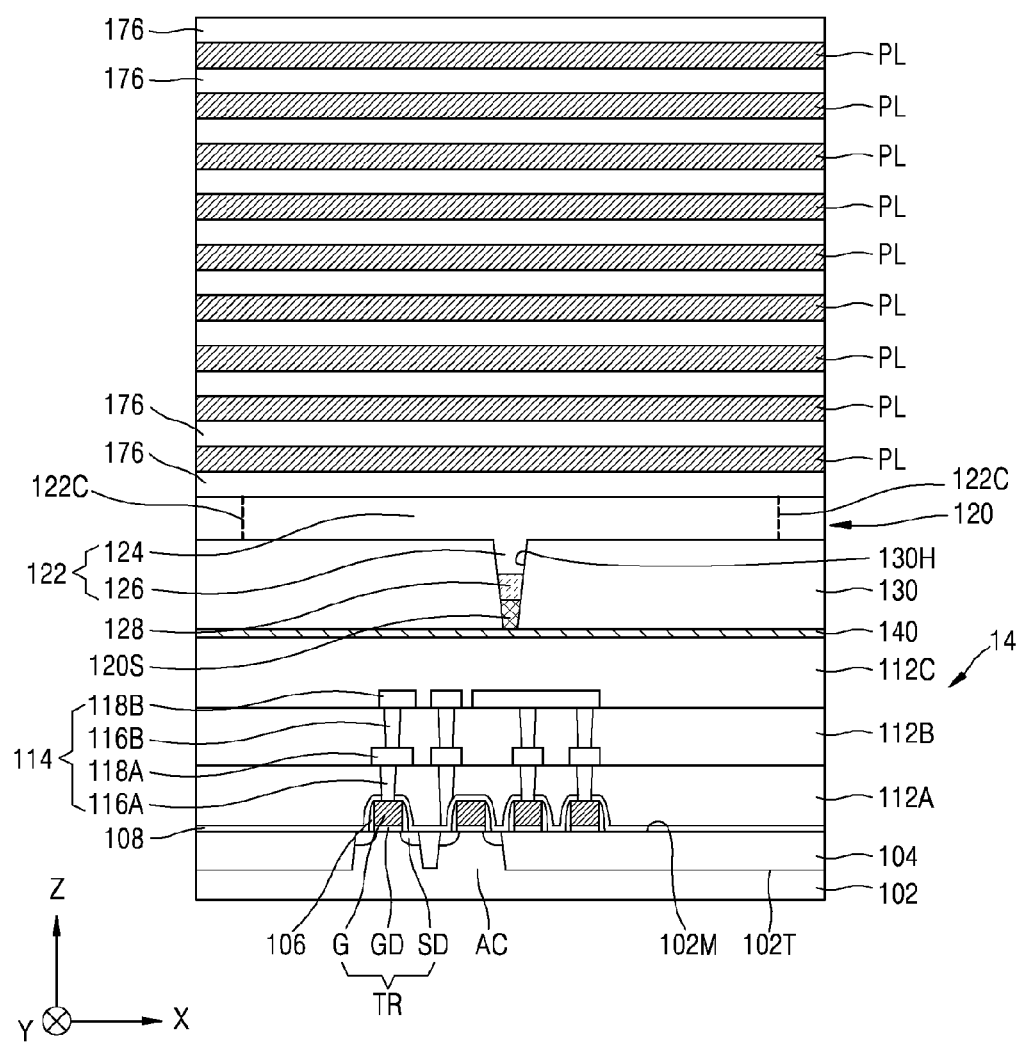

Referring to FIG. 13G, a plurality of insulating layers 176 and a plurality of preliminary gate layers PL are alternately stacked one by one on the polycrystalline silicon thin film 120.

The plurality of insulating layers 176 may be formed, for example, of silicon oxide, silicon nitride, or silicon oxynitride. The plurality of preliminary gate layers PL may be formed, for example, of silicon nitride, silicon carbide, or polysilicon. Each of the plurality of preliminary gate layers PL may be a preliminary layer or a sacrificial layer for forming at least one ground selection line GSL, a plurality of word lines WL1, WL2, ..., WLn−1, and WLn, and at least one string selection line SSL in subsequent processes.

Figure 13H:
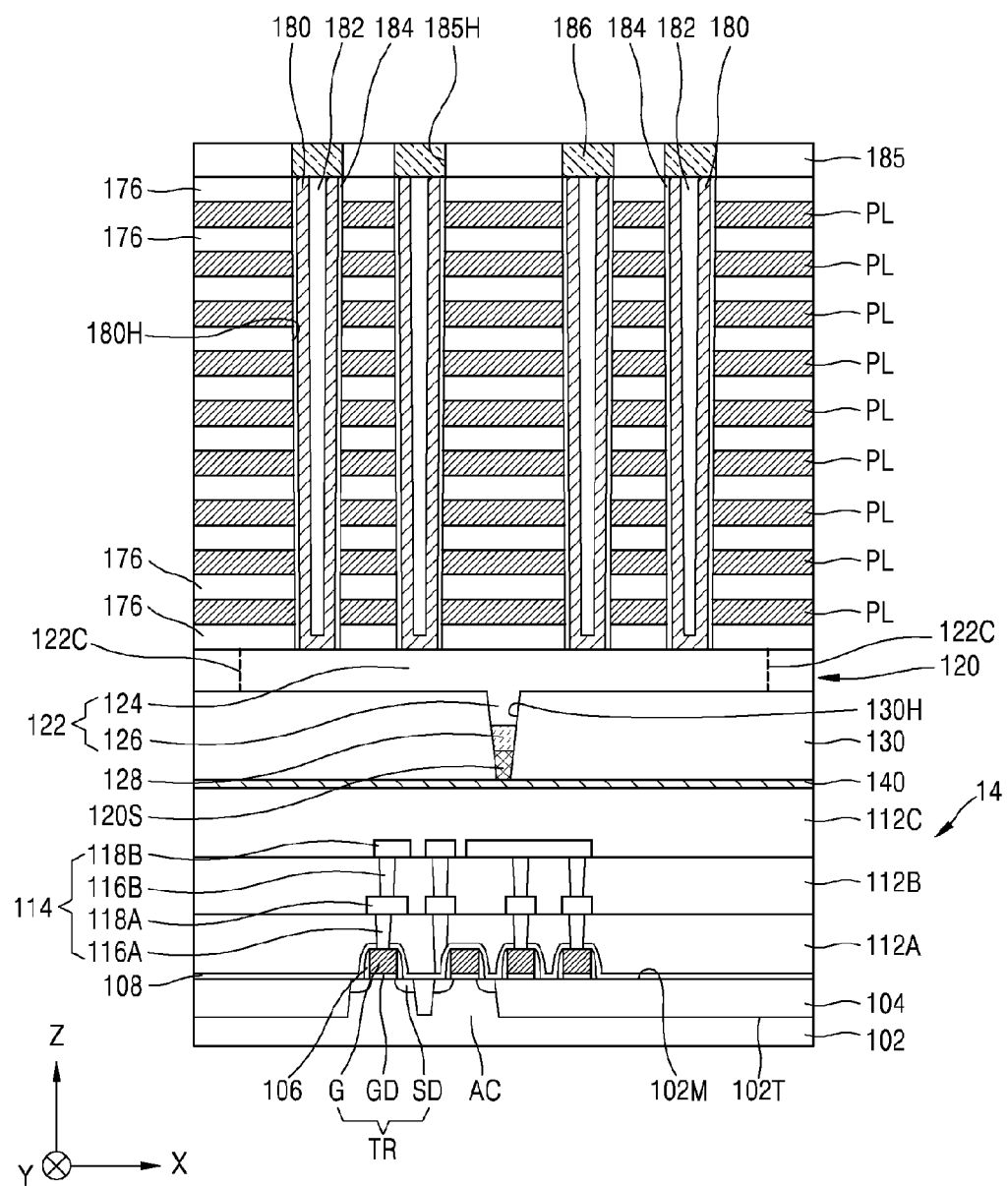

Referring to FIG. 13H, after forming a plurality of channel holes 180H that penetrate the plurality of insulating layers 176 and the plurality of preliminary gate layers PL and extend in a direction (the Z direction) which is perpendicular to an extending direction (the X direction) of the flat portion 124 of the silicon single crystal 122 in the polycrystalline silicon thin film 120, a gate insulating layer 184, a channel layer 180, and a buried insulating layer 182 are formed on the sidewall and bottom of each of the plurality of channel holes 180H.

The gate insulating layer 184 may include a blocking insulating layer, a charge storage layer, and a tunnel insulating layer, sequentially formed on the sidewall of each of the plurality of channel holes 180H.

The channel layer 180 may contact the flat portion 124 of the silicon single crystal 122 in the polycrystalline silicon thin film 120, exposed at the bottom of the channel hole 180H, and the outer surface of the channel layer 180 may contact the gate insulating layer 184. The channel layer 180 may be formed by a CVD process, an LPCVD process, or an atomic layer deposition (ALD) process by using polysilicon doped with impurities, but is not limited thereto.

The buried insulating layer 182 may be formed by a CVD process, an LPCVD process, or an ALD process by using an insulating material, such as silicon oxide, silicon nitride, or silicon oxynitride.

Next, after forming an insulating layer 185, which covers upper surfaces of the channel layer 180, the buried insulating layer 182, and the gate insulating layer 184, and forming a drain hole 185H, which exposes the upper surfaces of the channel layer 180 and the buried insulating layer 182, in the insulating layer 185, a drain region 186 is formed in the drain hole 185H. The insulating layer 185 may be formed, for example, of silicon oxide, silicon nitride, or silicon oxynitride. The drain region 186 may include, for example, polysilicon doped with impurities.

Figure 13I:
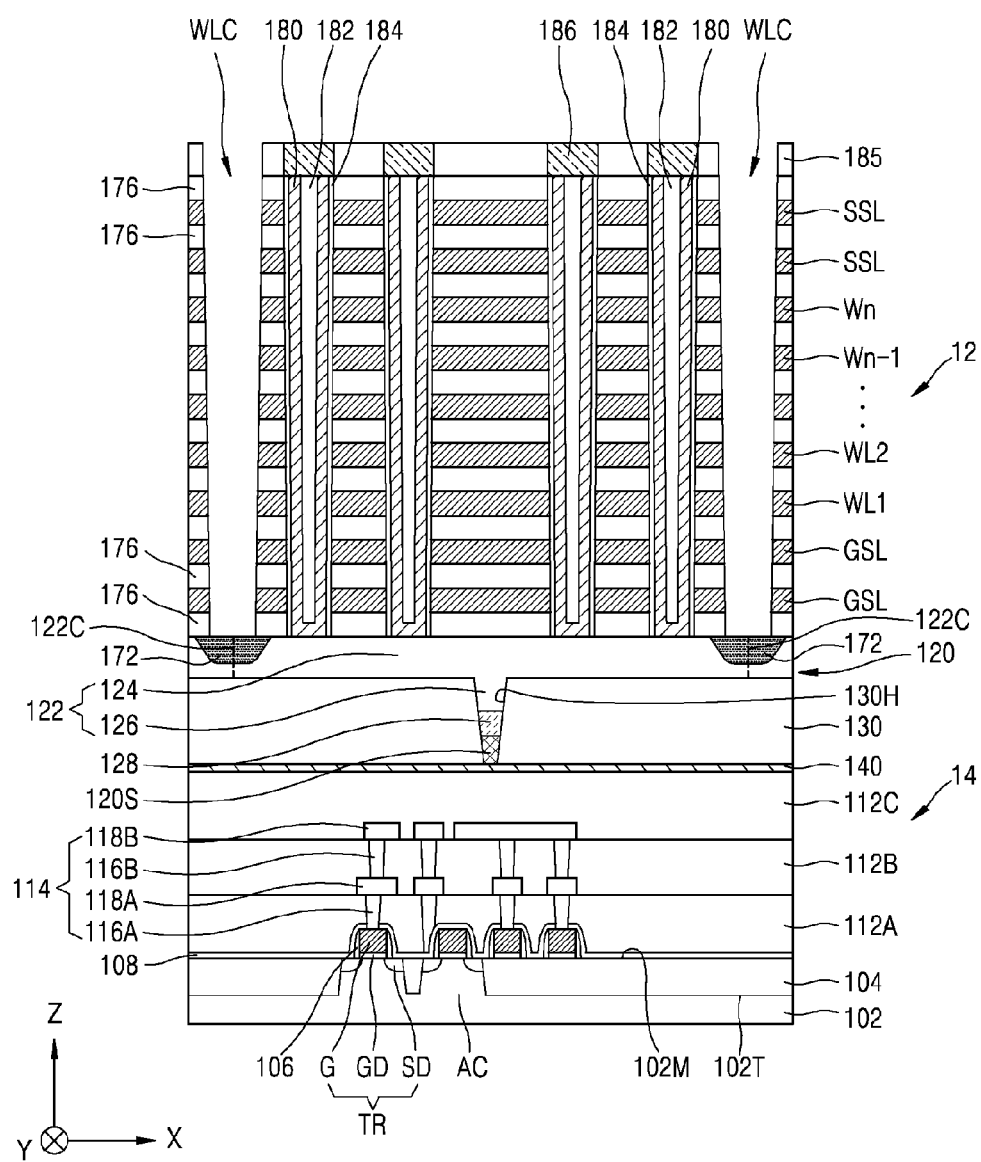

Referring to FIG. 13I, a plurality of word line cut regions WLC that penetrate the plurality of insulating layers 176 and the plurality of preliminary gate layers PL and expose the polycrystalline silicon thin film 120 are formed.

The plurality of word line cut regions WLC may be disposed to vertically overlap a portion of a grain boundary of the at least one silicon single crystal 122, similar to the cases explained with reference to FIGS. 4A, 4B, 12A, and 12B.

Next, a plurality of common source regions 172 are formed by implanting impurity ions into the at least one silicon single crystal 122 through the plurality of word line cut regions WLC, and a plurality of preliminary gate layers PL are substituted with a ground selection line GSL, a plurality of word lines WL1, WL2, . . . , WLn-1, and WLn, and a string selection line SSL.

In some exemplary embodiments for substituting the plurality of preliminary gate layers PL with a ground selection line GSL, a plurality of word lines WL1, WL2, . . . , WLn-1, and WLn, and a string selection line SSL, when the plurality of preliminary gate layers PL are formed of polysilicon, a silicification process may be performed on the plurality of preliminary gate layers PL. In this case, the ground selection line GSL, the plurality of word lines WL1, WL2, . . . , WLn-1, and WLn, and the string selection line SSL each may be formed of tungsten silicide, tantalum silicide, cobalt silicide, or nickel silicide, but is not limited thereto. In some other exemplary embodiments, after selectively removing the plurality of preliminary gate layers PL that are exposed through the plurality of word line cut regions WLC, the ground selection line GSL, the plurality of word lines WL1, WL2, . . . , WLn-1, and WLn, and the string selection line SSL may be formed by burying a conductive material in empty spaces that are formed between the plurality of insulating layers 176. In this case, the ground selection line GSL, the plurality of word lines WL1, WL2, . . . , WLn-1, and WLn, and the string selection line SSL may be formed by using a metal material, such as tungsten, tantalum, cobalt, or nickel.

Figure 13J:
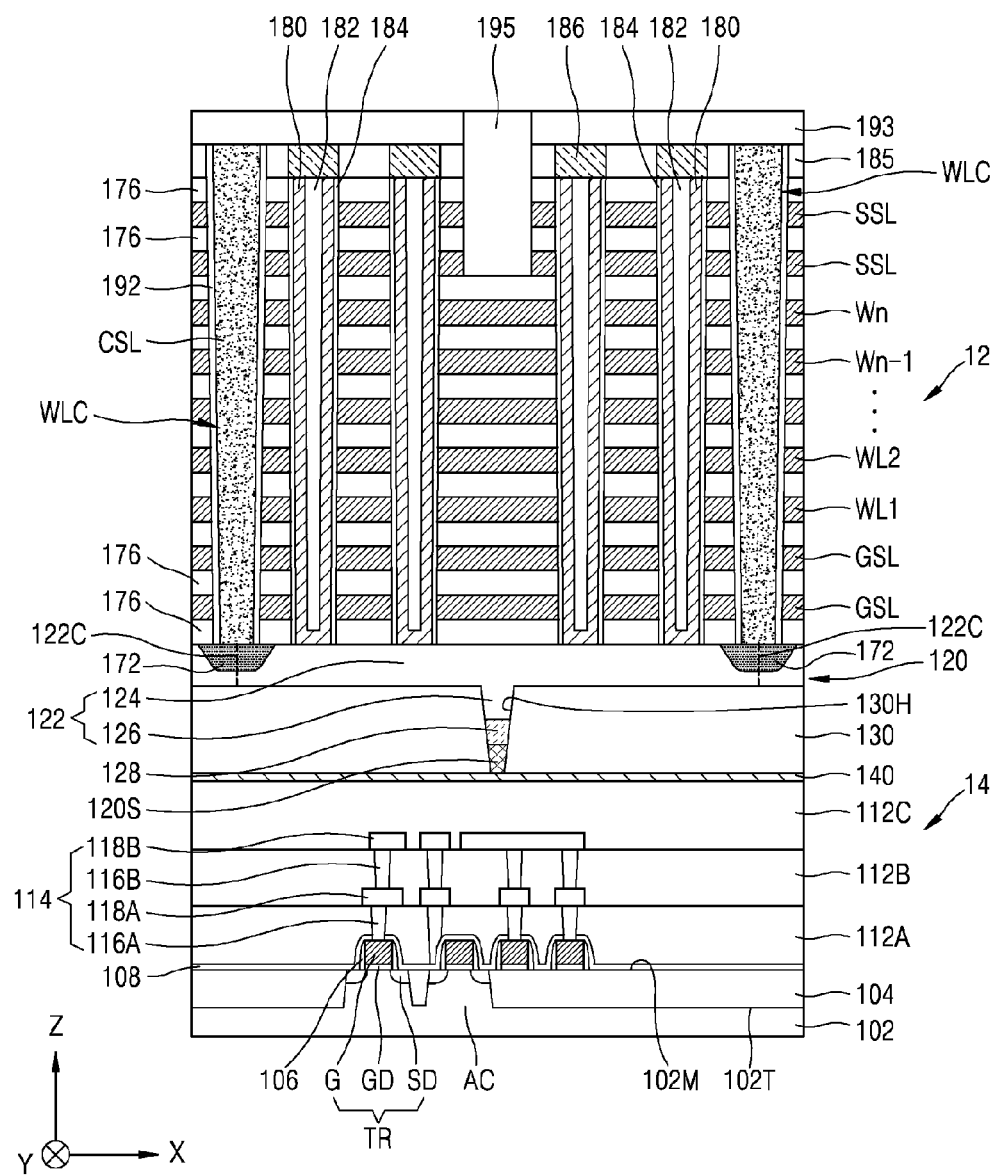

Referring to FIG. 13J, an insulating spacer 192 and a common source line CSL are formed in each of the plurality of word line cut regions WLC.

The insulating spacer 192 may be formed of silicon oxide, silicon nitride, or silicon oxynitride. The common source line CSL may be formed of a conductive material. For example, the common source line CSL may include at least one selected from tungsten (W), aluminum (Al), and copper (Cu). In some exemplary embodiments, a metal silicide layer (not shown) for lowering contact resistance may be interposed between the common source region 172 and the common source line CSL. For example, the metal silicide layer may be formed of cobalt silicide.

After forming an insulating layer 193 covering a plurality of common source lines CSL and a plurality of drain regions 186, a string selection line cut region SSLC (refer to FIG. 2C) is formed by removing portions of the insulating layers 176 and 193 and a portion of the string selection line SSL and is filled with the insulating layer 195.

Figure 13K:
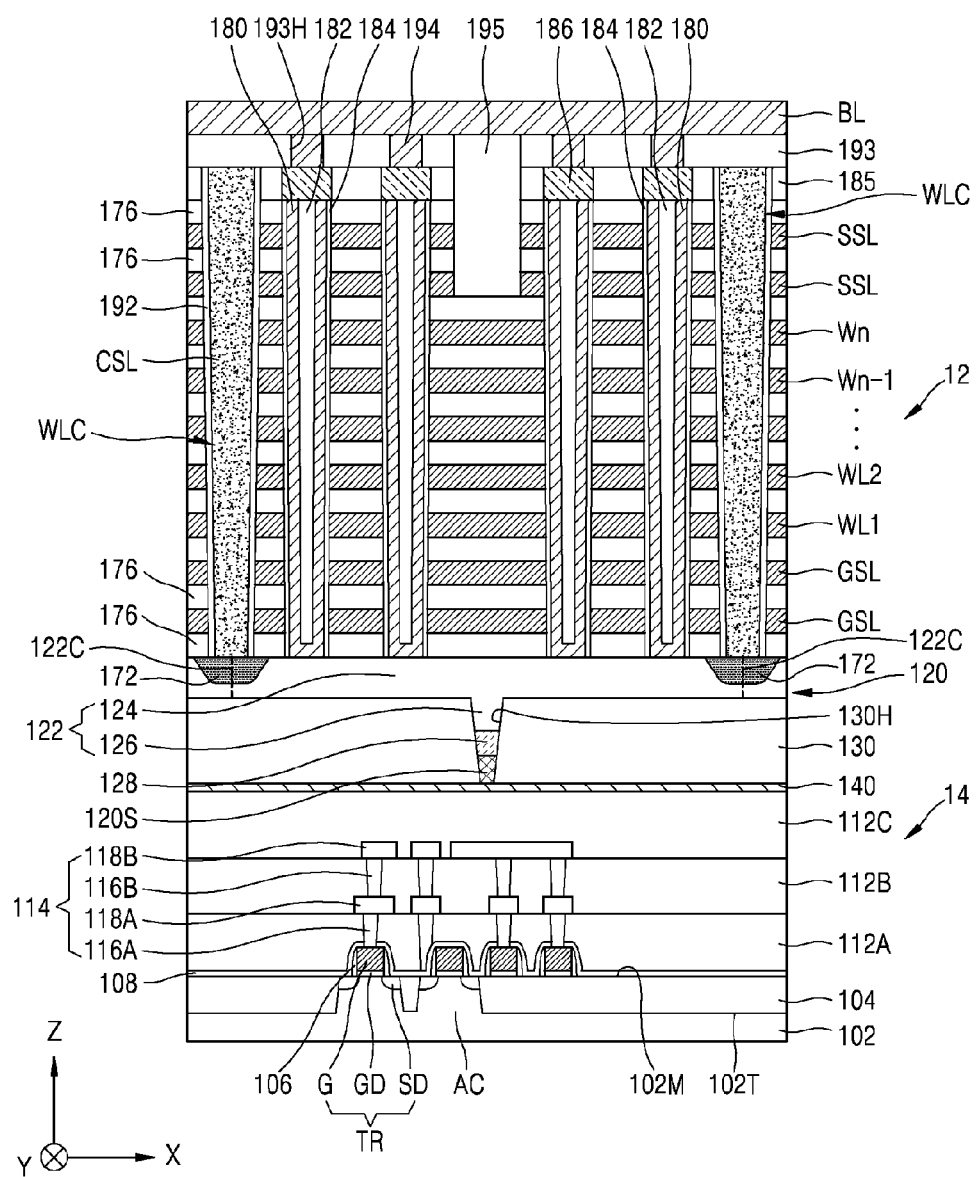

Referring to FIG. 13K, a plurality of bit line contact holes 193H exposing the plurality of drain regions 186 are formed by removing a portion of the insulating layer 193 and are filled with a conductive material to form a plurality of bit line contact 194.

Subsequently, a bit line BL that is connected to the plurality of bit line contacts 194 is formed on the insulating layer 193.

The IC device 100 illustrated in FIGS. 2A through 2C may be formed by using the processes described above.

In the method of manufacturing the IC device 100 described with reference to FIGS. 13A through 13K, a memory cell array MCA may be formed on the plurality of silicon single crystals 122B by using the polycrystalline silicon thin film 120, which includes the plurality of silicon single crystals 122, as an active region during the formation of the memory cell array region 12. A plurality of word line cut regions WLC exposing at least one silicon single crystal 122 may be formed to form the memory cell array MCA. The plurality of word line cut regions WLC may be disposed to vertically overlap a portion of a grain boundary of the at least one silicon single crystal 122, similar to the cases explained with reference to FIGS. 4A, 4B, 12A, and 12B. The polycrystalline silicon thin film 120 includes the plurality of silicon single crystals 122 having controlled crystal sizes and positions so as not to include a grain boundary in an active region that is divided into regions each having a predetermined size to include a unit region in which a plurality of memory cell strings MS are formed. Accordingly, the inclusion of an irregular grain boundary, which generates a number of silicon unpaired electrons, in an active region of the memory cell array region 12 may be suppressed, and degradation of electrical characteristics of a second level semiconductor device that is formed on the active region may be prevented. In particular, by controlling a silicon crystal size to prevent electron scattering in which electrons irregularly collide with each other while passing through a silicon grain boundary in a current flow path of the active region and thus carrier mobility is reduced, carrier mobility in the active region may be improved and thus electrical characteristic of the IC device 100 may be improved.

Figure 14A:
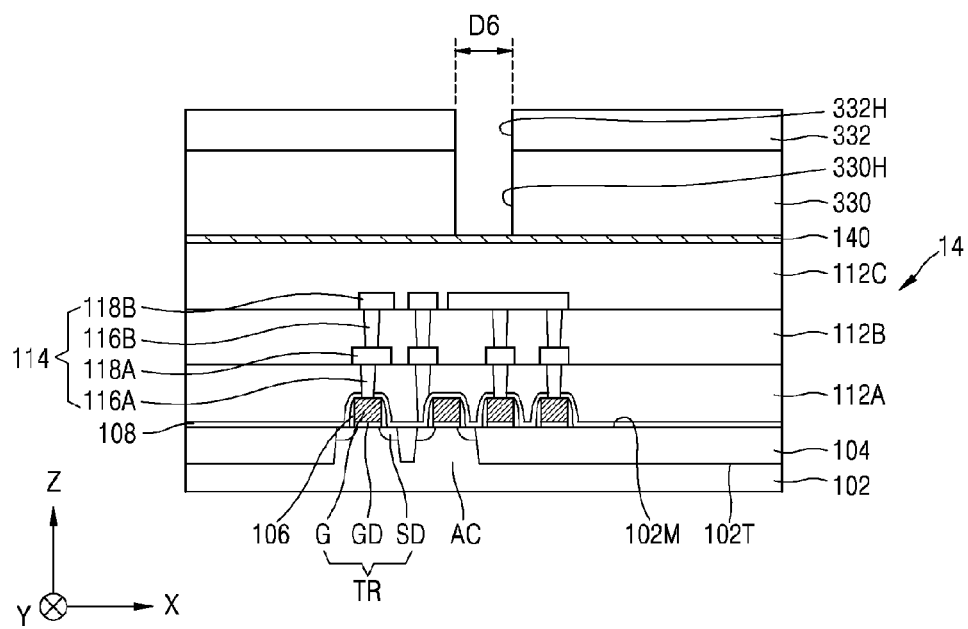
FIGS. 14A through 14C are cross-sectional views that sequentially illustrate a method of manufacturing an IC device, according to another exemplary embodiment of the inventive concept.
Figure 14B:
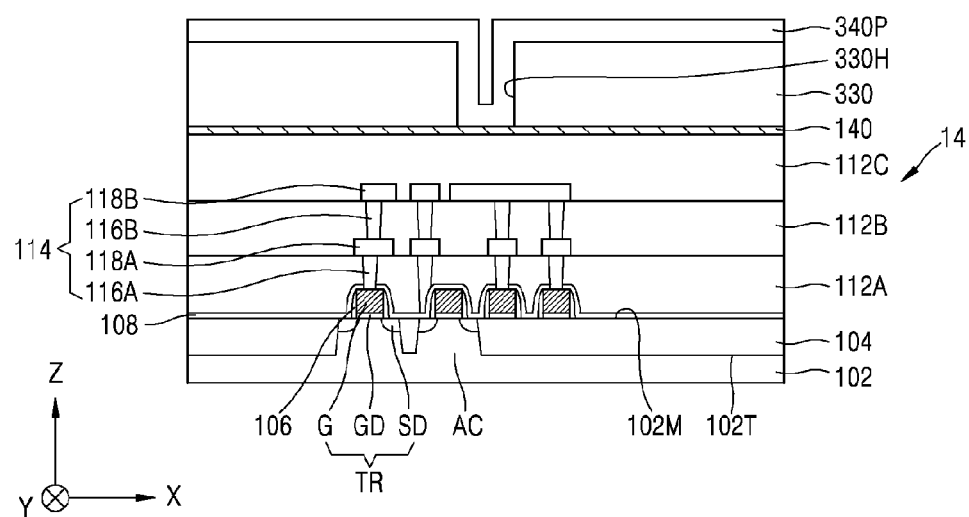
Figure 14C:
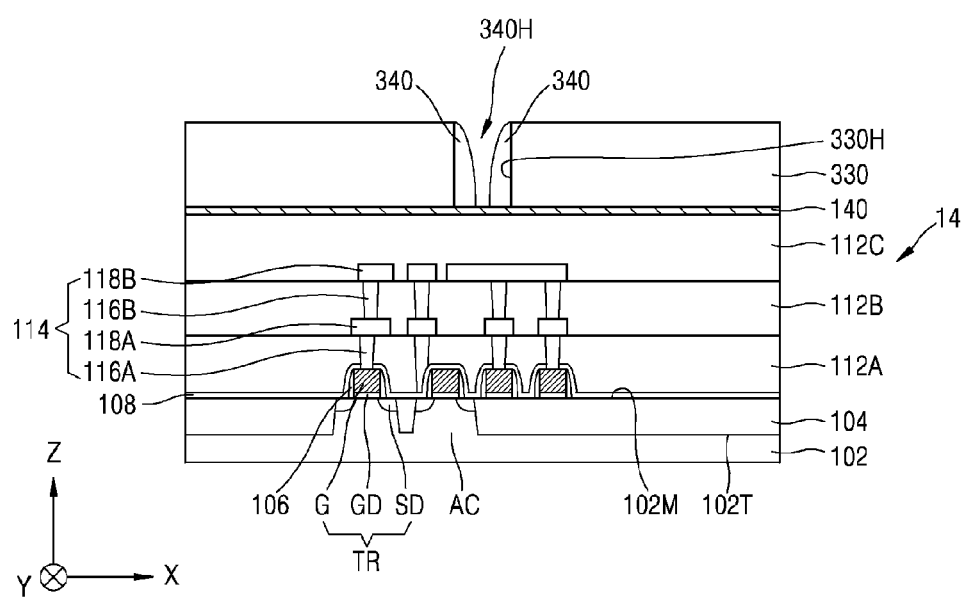

FIGS. 14A through 14C are cross-sectional views that sequentially illustrate a method of manufacturing an IC device, according to another exemplary embodiment of the inventive concept. In the current exemplary embodiment, a method of manufacturing the IC device 300 illustrated in FIG. 6 is described as an example. Reference numerals in FIGS. 14A through 14C which are the same as those in FIGS. 13A through 13K denote the same elements, and thus their repeated description will be omitted.

Referring to FIG. 14A, an insulating thin film 140 and an inter-device dielectric layer 330 are sequentially formed on an interlayer insulating layer 112C by using a method that is the same as the method of forming the insulating thin film 140 and the inter-device dielectric layer 130, described with reference to FIGS. 13A and 13B. Details of the inter-device dielectric layer 330 are the same as those explained with respect to the inter-device dielectric layer 130 with reference to FIG. 13B.

Next, a mask pattern 332, in which at least one opening 332H has been formed to expose the inter-device dielectric layer 330, is formed on the inter-device dielectric layer 330, and at least one pinhole 330H is formed in the inter-device dielectric layer 330 by etching the inter-device dielectric layer 330 by using the mask pattern 332 as an etch mask and using the insulating thin film 140 as an etch stop layer.

In some exemplary embodiments, an inner diameter D6 of the inlet of the at least one pinhole 330H that is formed in the inter-device dielectric layer 330 may be larger than the inner diameter D5 of the inlet of the pinhole 130H illustrated in FIG. 13C. For example, the at least one hole 330H may have the diameter D6 of about 200 nm to about 300 nm, but is not limited thereto.

Referring to FIG. 14B, after removing the mask pattern 332 from the resultant structure of FIG. 14A to expose an upper surface of the inter-device dielectric layer 330, an insulating layer 340P is formed to uniformly cover an inner wall of the at least one hole 330H formed in the inter-device dielectric layer 330 and the upper surface of the inter-device dielectric layer 330.

The insulating layer 340P may be formed of a material having etch selectivity that is different from that of the material of the inter-device insulating layer 330. In some exemplary embodiments, when the inter-device dielectric layer 330 is formed of oxide, the insulating layer 340P may be formed of nitride.

Referring to FIG. 14C, an insulating spacer 340 covering an inner sidewall of the at least one hole 330H is formed by performing an etch-back process on the insulating layer 340P.

After the insulating spacer 340 is formed in the at least one hole 330H, a pinhole 340H having a width that is defined by the insulating spacer 340 is formed in the at least one hole 330H.

The bottom of the pinhole 340H, which is adjacent to the insulating thin film 140, may have an inner diameter that is small enough to provide an effective grain filter effect in the crystallization process as explained with reference to FIG. 13F. In some exemplary embodiments, the bottom of the pinhole 340H may have an inner diameter of about 100 nm or less, for example, an inner diameter of about 60 nm to about 100 nm.

The inlet of the pinhole 340H may have an inner diameter that is larger than that of the bottom of the pinhole 340H. Thus, during a deposition process for forming the amorphous silicon layer 120A, explained with reference to FIG. 13D, in the pinhole 340H, the formation of voids in the pinhole 340H may be effectively suppressed.

Subsequently, processes as explained with reference to FIGS. 13D through 13K may be performed to form the IC device 300 illustrated in FIG. 6.

FIGS. 15A through 15E are cross-sectional views that sequentially illustrate a method of manufacturing an IC device, according to another exemplary embodiment of the inventive concept. In the current exemplary embodiment, a method of manufacturing the IC device 700 illustrated in FIG. 11 is described as an example. Reference numerals in FIGS. 15A through 115E which are the same as those in FIGS. 13A through 13K denote the same elements, and thus their repeated description will be omitted.

Figure 15A:
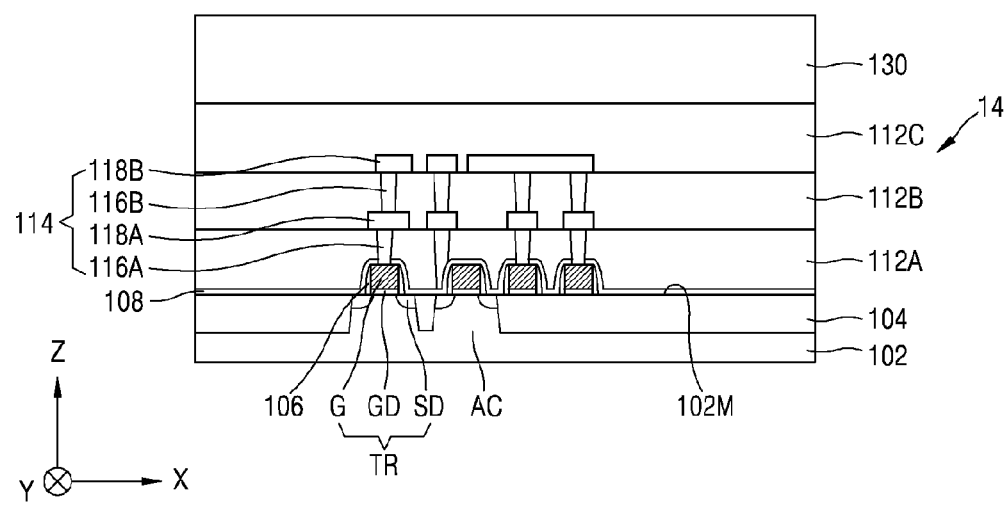
FIGS. 15A through 15E are cross-sectional views that sequentially illustrate a method of manufacturing an IC device, according to another exemplary embodiment of the inventive concept.

Referring to FIG. 15A, an inter-device dielectric layer 130 is formed on an interlayer insulating layer 112C by using processes as described with reference to FIGS. 13A and 13B. In the current exemplary embodiment, a process of forming the insulating thin film 140 illustrated in FIGS. 13A through 13C is omitted. Accordingly, the inter-device dielectric layer 130 may be formed just on the interlayer insulating layer 112C.

Figure 15B:
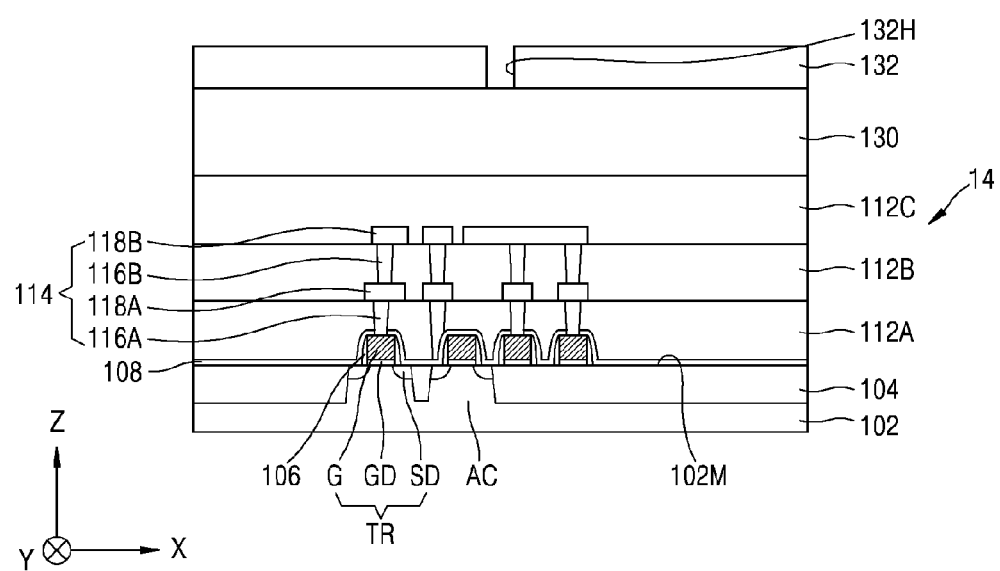

Referring to FIG. 15B, a mask pattern 132, in which at least one opening 132H has been formed to expose the inter-device dielectric layer 130, is formed on the inter-device dielectric layer 130.

Figure 15C:
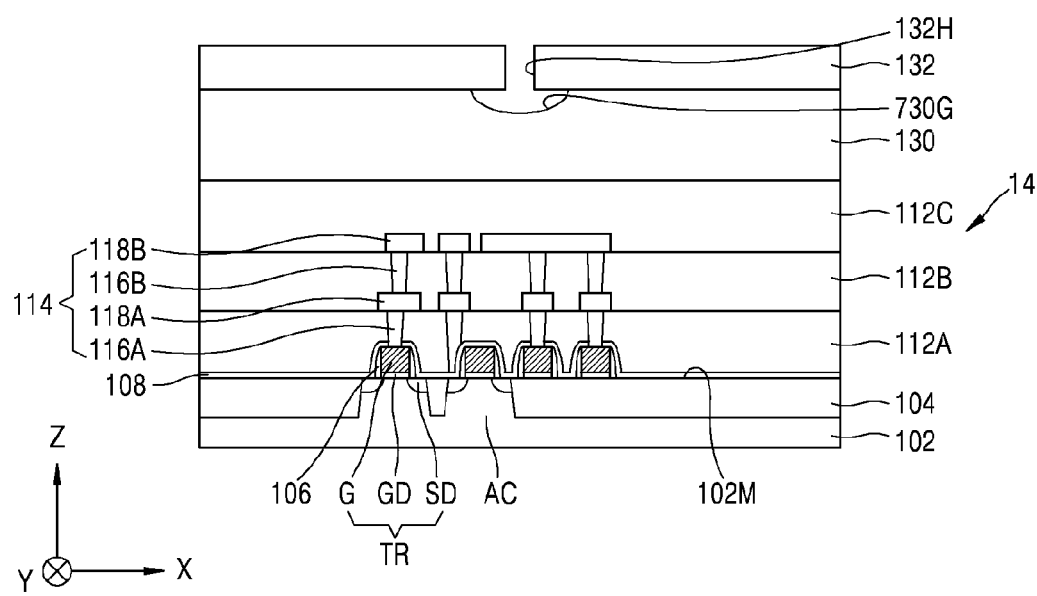

Referring to FIG. 15C, a groove 730G is formed in the inter-device dielectric layer 130 by isotropically etching a portion of the inter-device dielectric layer 130 by using the mask pattern 132 as an etch mask.

A wet etching process may be used to form the groove 730G.

Figure 15D:
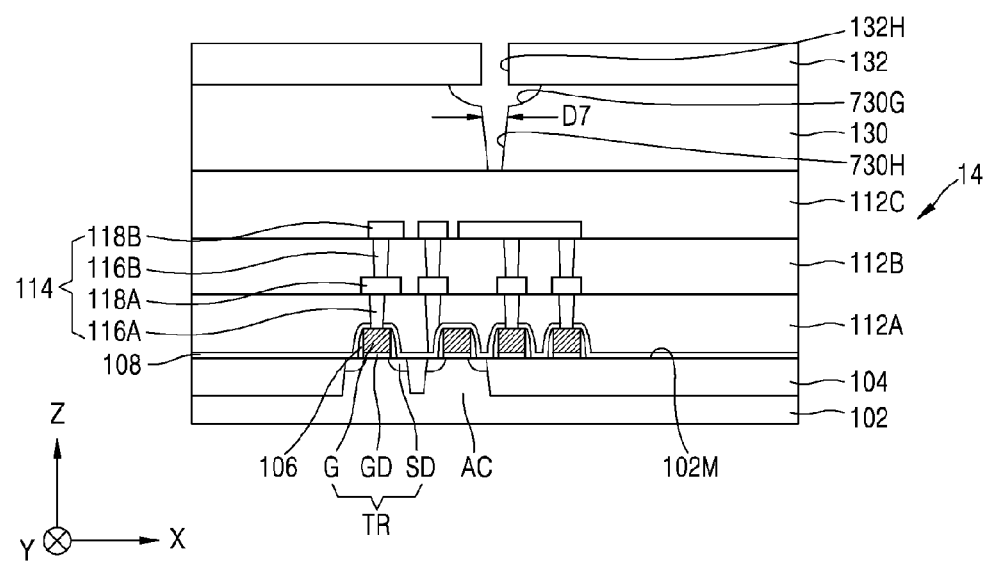

Referring to FIG. 15D, a pinhole 730H communicating with the groove 730G is formed by anisotropically etching an exposed portion of the inter-device dielectric layer 130 by using the mask pattern 132 as an etch mask.

The pinhole 730H may be formed to have an inner diameter D7 of about 100 nm or less at the inlet thereof. For example, the pinhole 730H may have the inner diameter D7 of about 60 nm to about 100 nm.

Although an upper surface of the interlayer insulating layer 112C that is the uppermost layer in a first peripheral circuit region 14 is exposed at the bottom of the pinhole 730H, the inventive concept is not limited thereto. For example, the pin hole 730H may be formed to partially penetrate the interlayer insulating layer 112C, similar to the IC device 500 illustrated in FIG. 9. In another example, the pin hole 730H may be formed in a blind hole form in which the pin hole 730H penetrates only a portion of the inter-device dielectric layer 130, similar to the IC device 600 illustrated in FIG. 10.

Figure 15E:
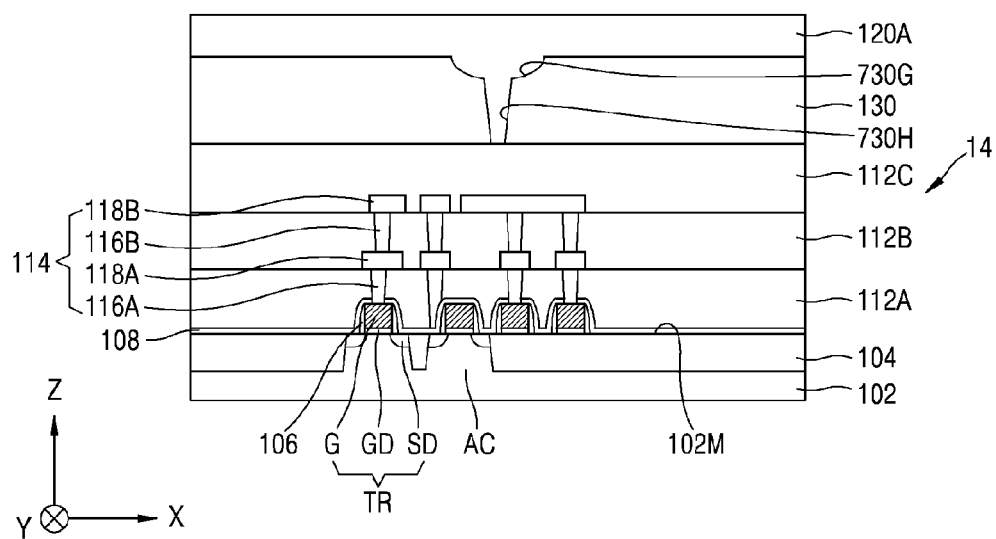

Referring to FIG. 15E, after exposing an upper surface of the inter-device dielectric layer 130 by removing the mask pattern 132, an amorphous silicon layer 120A is formed to cover the upper surface of the inter-device dielectric layer 130 while filling the insides of the groove 730G and the pinhole 730H, formed in the inter-device dielectric layer 130.

Since the groove 730G has an inner diameter that is larger than that of the pinhole 730H, the formation of voids in the groove 730G and the pinhole 730H may be effectively suppressed during a deposition process for forming the amorphous silicon layer 120A in the groove 730G and the pinhole 730H.

Subsequently, processes as explained with reference to FIGS. 13E through 13K may be performed to form the IC device 700 illustrated in FIG. 11.

As described above, exemplary methods of manufacturing the IC devices 100, 300, and 700 illustrated in FIGS. 2A through 2C, 6, and 11 and effects of the exemplary methods have been explained with reference to FIGS. 13A through 13K, 14A through 14C, and 15A through 15E. However, by variously modifying or changing the exemplary methods, the IC devices 200, 300, 400, 500, 600, and 700 illustrated in FIGS. 5, 6, and 8 through 11 or IC devices having structures modified or changed from the IC devices 200, 300, 400, 500, 600, and 700 may be manufactured.

Figure 16:
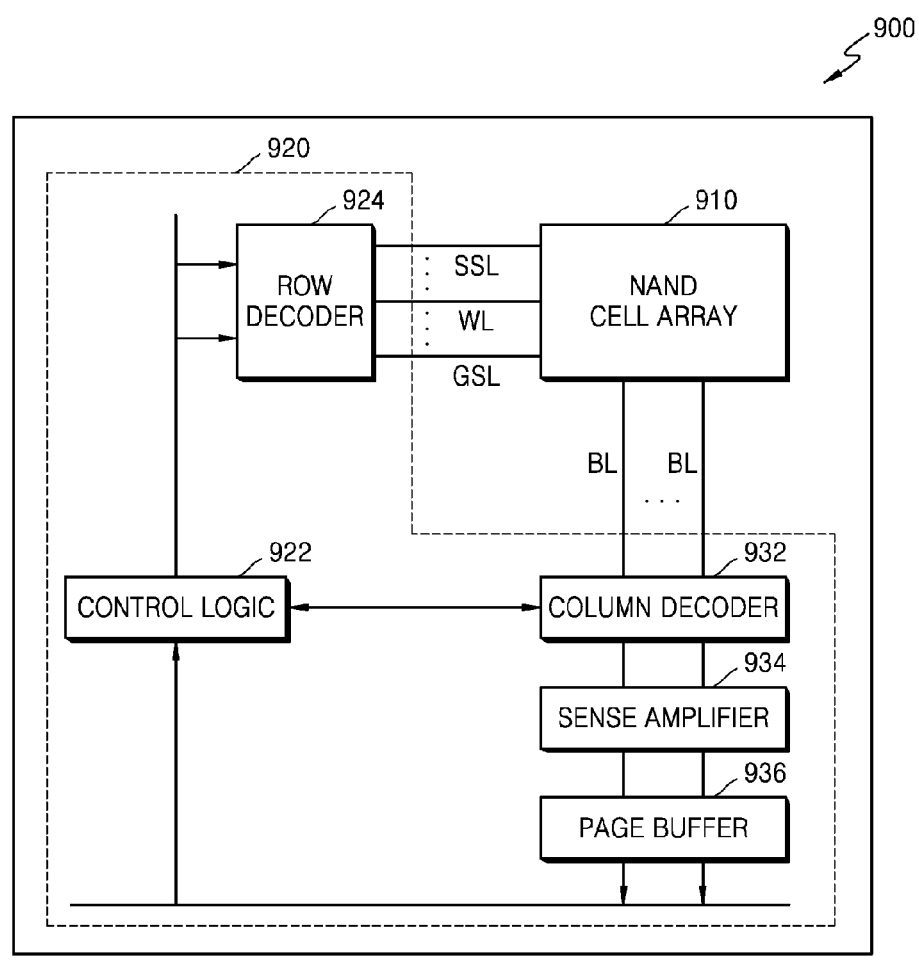
FIG. 16 is a schematic block diagram of a nonvolatile memory device using an IC device according to an exemplary embodiment of the inventive concept.

FIG. 16 is a schematic block diagram of semiconductor device such as a nonvolatile memory device 900 using an IC device according to any one of the exemplary embodiments of the inventive concept.

As used herein, a semiconductor device may refer to any of the various devices such as shown in FIGS. 1-15, or to certain portions thereof. For example, a semiconductor device may refer to the memory cell array portion of the integrated circuit device shown in the various figures, or may refer to the peripheral portion of the integrated circuit device. A semiconductor device may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 16, a NAND cell array 910 of the nonvolatile memory device 900 may be combined with a core circuit unit 920. For example, the NAND cell array 910 may include any one of the IC devices 10, 100, 200, 300, 400, 500, 600, and 700 explained with reference to FIGS. 1 through 15E. The core circuit unit 920 may include a control logic 922, a row decoder 924, a column decoder 932, a sense amplifier 934, and a page buffer 936.

The control logic 922 may communicate with the row decoder 924, the column decoder 932, and the page buffer 936. The row decoder 924 may communicate with the NAND cell array 910 through a plurality of string selection lines SSL, a plurality of word lines WL, and a plurality of ground selection lines GSL. The column decoder 932 may communicate with the NAND cell array 910 through a plurality of bit lines BL. The sense amplifier 934 may be connected to the column decoder 932 when a signal is output from the NAND cell array 910 and may not be connected to the column decoder 932 when a signal is transmitted to the NAND cell array 910.

For example, the control logic 922 may transmit row address signals to the row decoder 924, and the row decoder 924 may decode the row address signals and transmit decoded row address signals to the NAND cell array 910 through the plurality of string selection lines SSL, the plurality of word lines WL, and the plurality of ground selection lines GSL. The control logic 922 may transmit column address signals to the column decoder 932 or the page buffer 936, and the column decoder 932 may decode the column address signals and transmit decoded column address signals to the NAND cell array 910 through the plurality of bit lines BL. Output signals of the NAND cell array 910 may be transmitted to the sense amplifier 934 via the column decoder 932 and be amplified by the sense amplifier 934, and the amplified output signals may be transmitted to the control logic 922 via the page buffer 936.

Figure 17:
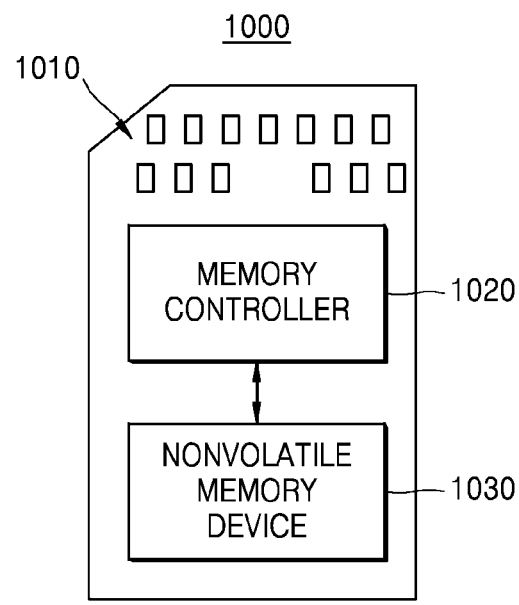
FIG. 17 is a block diagram of a memory system using an IC device according to an exemplary embodiment of the inventive concept.

FIG. 17 is a block diagram of a memory system 1000 using an IC device according to any one of the exemplary embodiments of the inventive concept.

Referring to FIG. 17, the memory system 1000 includes a plurality of connection pins 1010, a memory controller 1020, and a nonvolatile memory device 1030.

The plurality of connection pins 1010 may be connected to a host (not shown) so that signals are transmitted to the host or received from the host. The plurality connection pins 1010 may include a clock pin, a command pin, a data pin, and/or a reset pin.

The memory controller 1020 may receive data from the host and store the received data in the nonvolatile memory device 1030.

The nonvolatile memory device 1030 may include any one of the IC devices 10, 100, 200, 300, 400, 500, 600, and 700 explained with reference to FIGS. 1 through 15E.

In some exemplary embodiments, the memory system 1000 may be an electronic device such as a memory card. For example, the memory system 1000 may be a memory card, such as a multimedia card (MMC), an embedded multimedia card (eMMC), a hybrid embedded multimedia card (hybrid eMMC), a secure digital (SD) card, a micro SD card, a memory stick, an identification (ID) card, a personal computer memory card international association (PCMCIA) card, a chip card, a universal serial bus (USB) card, a smart card, or a compact flash (CF) card.

In some exemplary embodiments, the memory system 1000 may be mounted on an electronic device comprising a host, such as a computer, a laptop, a cellular phone, a smart phone, an MP3 player, a personal digital assistants (PDA), a portable multimedia player (PMP), a digital TV, a digital camera, or a portable game console.

Figure 18:
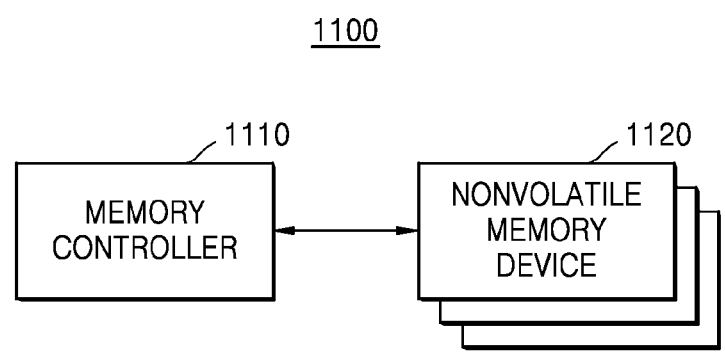
FIG. 18 is a block diagram of a solid state drive (SSD)-type memory system using an IC device according to an exemplary embodiment of the inventive concept.

FIG. 18 is a block diagram of a solid state drive (SSD)-type memory system 1100 using an IC device according to any one of the exemplary embodiments of the inventive concept.

Referring to FIG. 18, the memory system 1100 includes a memory controller 1110 and a plurality of nonvolatile memory devices 1120.

The memory controller 1110 may receive data from a host (not shown) and store the received data in the nonvolatile memory devices 1120.

Each of the plurality of nonvolatile memory devices 1120 may include any one of the IC devices 10, 100, 200, 300, 400, 500, 600, and 700 explained with reference to FIGS. 1 through 15E.

The memory system 1100 may be mounted on a host, such as a computer, a laptop, a cellular phone, a smart phone, an MP3 player, a PDA, a PMP, a digital TV, a digital camera, or a portable game console.

Figure 19:
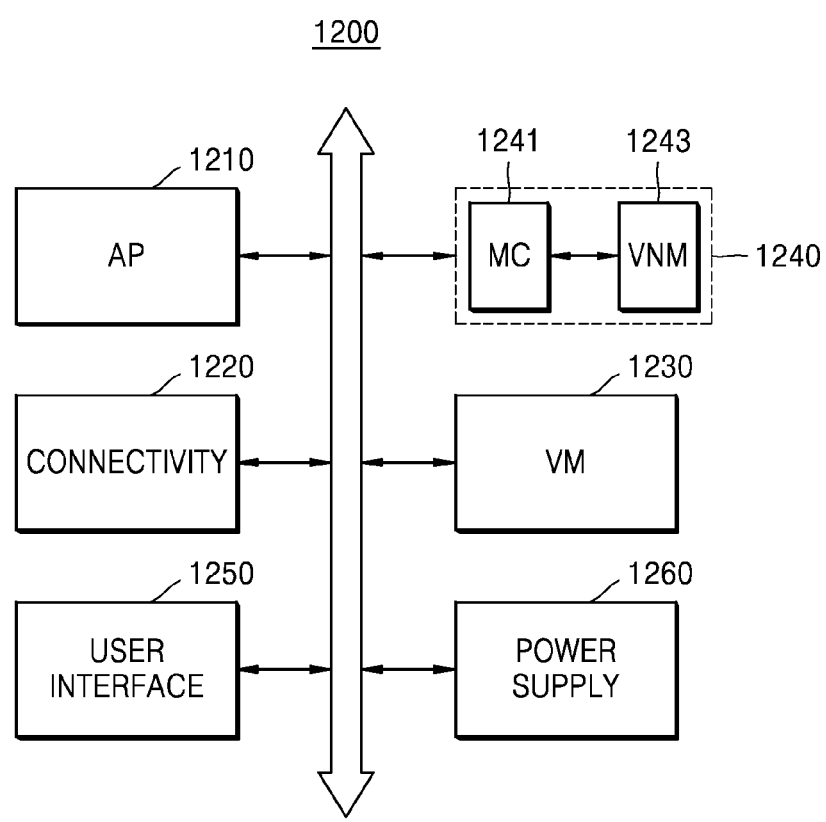
FIG. 19 is a block diagram of a mobile system using an IC device according to an exemplary embodiment of the inventive concept.

FIG. 19 is a block diagram of a mobile system 1200 using an IC device according to any one of the exemplary embodiments of the inventive concept.

Referring to FIG. 19, the mobile system 1200 includes an application processor 1210, a connectivity unit 1220, a volatile memory device 1230, a nonvolatile memory system 1240, a user interface 1250, and a power supply 1260.

The mobile system 1200 may be a mobile phone, a smart phone, a PDA, a PMP, a digital camera, a music player, a portable game console, or a navigation system.

The application processor 1210 may perform applications providing internet browsers, games, or videos. In some exemplary embodiments, the application processor 1210 may include a single core or a multi-core. For example, the application processor core 1210 may include a multi-core, such as a dual-core, a quad-core, or a hexa-core. Also, the application processor 1210 may further include a cache memory located in the inside or outside thereof.

The connectivity unit 1220 may communicate with an external device by wire or wireless. For example, the connectivity unit 1220 may perform Ethernet communication, near field communication (NFC), radio frequency identification (RFID) communication, mobile telecommunication, memory card communication, or USB communication. For example, the connectivity unit 1220 may include a baseband chipset and support GSM, GPRS, WCDMA, HS×PA, and the like.

The volatile memory device 1230 may store data that is processed by the application processor 1210 or may operate as a working memory. For example, the volatile memory device 1230 may be implemented with dynamic random access memory (DRAM), static random access memory (SRAM), mobile DRAM, double data rate (DDR) synchronous DRAM (DDR SDRAM), low power DDR (LPDDR) SDRAM, graphic DDR (GDDR) SDRAM, Rambus DRAM (RDRAM), or a memory that is similar thereto.

The nonvolatile memory system 1240 may include a memory controller 1241 and a nonvolatile memory device 1243 and store a boot image for booting the mobile system 1200. For example, the nonvolatile memory device 1143 may be implemented with electrically erasable programmable read-only memory (EEPROM), a flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a memory that is similar thereto. The nonvolatile memory device 1243 may include any one of the IC devices 10, 100, 200, 300, 400, 500, 600, and 700 explained with reference to FIGS. 1 through 15E.

The user interface 1250 may include one or more input devices, such as a keypad or a touch screen, and/or one or more output devices, such as a speaker or a display device.

The power supply may supply an operating voltage of the mobile system 1200. Also, the mobile system 1200 may further include a camera image processor (CIS) and a storage device, such as a memory card, a SSD, a hard disk drive (HDD), or a CD-ROM.

The mobile system 1200 may be mounted by using packages of various types. For example, the mobile system 1200 may be mounted by using packages, such as package on package (PoP), ball grid array (BGA), chip scale package (CSP), plastic leaded chip carrier (PLCC), plastic dual in-line package (PDIP), die in waffle pack (DWP), die in wafer form (DWF), chip on board (COB), ceramic dual in-line package (CERDIP), plastic metric quad flat pack (MQFP), thin quad flat-pack (TQFP), small outline IC (SOIC), shrink small outline package (SSOP), thin small outline package (TSOP), thin quad flat-pack (TQFP), system in package (SIP), multi chip package (MCP), wafer-level fabricated package (WFP), and wafer-level processed stack package (WSP).

While aspects of the inventive concept have been particularly shown and described with reference to exemplary embodiments thereof, it will be understood that various changes in form and details may be made therein without departing from the spirit and scope of the following claims.

What is claimed is:

1. A method of manufacturing an integrated circuit (IC) device, the method comprising:
    forming a first level semiconductor device on a substrate;
    forming an inter-device dielectric layer that covers the first level semiconductor device;
    forming a pinhole that penetrates at least a portion of the inter-device dielectric layer;
    forming a polycrystalline silicon thin film comprising at least one silicon single crystal that extends from an inside of the pinhole up to an upper surface of the inter-device dielectric layer; and
    forming a second level semiconductor device on the polycrystalline silicon thin film by using the at least one silicon single crystal as an active region.

2. The method of claim 1, wherein the forming of the polycrystalline silicon thin film comprises:
    forming an amorphous silicon layer that covers an upper surface of the inter-device dielectric layer while filling the pinhole;
    applying heat to the amorphous silicon layer from an upper side of the amorphous silicon layer to relieve stress in a portion of the amorphous silicon layer; and
    solidifying a melted portion of the amorphous silicon layer by using a portion of the amorphous silicon layer, which remains in a solid state in the pinhole, as a seed.

3. The method of claim 1, wherein the forming of the polycrystalline silicon thin film comprises radiating a laser beam onto the amorphous silicon layer.

4. The method of claim 1, wherein the forming of the polycrystalline silicon thin film comprises annealing the amorphous silicon layer to form a silicon crystal comprising a flat portion providing an active region of the second level semiconductor device and a pin-shaped protruding portion protruding from the flat portion toward the first level semiconductor device.

5. The method of claim 1, wherein the forming of the inter-device dielectric layer comprises forming a reflective mirror layer comprising a plurality of insulating layers having different reflective indexes, and
    the forming of the polycrystalline silicon thin film comprises:
    radiating a laser beam onto the amorphous silicon layer from an upper side of the amorphous silicon layer; and
    reflecting the radiated laser beam by using the reflective mirror layer.

6. The method of claim 1, wherein the forming of the pinhole comprises:
    forming a hole having a first width in the inter-device dielectric layer; and
    forming an insulating spacer that covers an inner wall of the hole and defines the pinhole, which has a second width which is smaller than the first width, in the hole.

7. The method of claim 1, wherein in the forming of the pinhole, the pinhole is formed so that an inner diameter of an inlet of the pinhole is larger than that of a bottom of the pinhole.

8. A method of manufacturing an integrated circuit (IC) device, the method comprising:
    forming a peripheral circuit on a substrate;
    forming an inter-device dielectric layer, which covers the peripheral circuit, on the peripheral circuit;

forming a pinhole that penetrates at least a portion of the inter-device dielectric layer;

forming a polycrystalline silicon thin film comprising at least one silicon single crystal that extends from an inside of the pinhole up to an upper surface of the inter-device dielectric layer; and forming a memory cell array on the polycrystalline silicon thin film by using the at least one silicon single crystal as an active region, the memory cell array comprising a plurality of memory cell strings disposed to vertically overlap the peripheral circuit.

9. The method of claim 8, wherein the forming of the memory cell array comprises forming the plurality of memory cell strings on a silicon single crystal of the polycrystalline silicon thin film by using the silicon single crystal of the polycrystalline silicon thin film as an active region.

10. The method of claim 8, wherein the memory cell array comprises a plurality of word line cut regions that are separate from one another with the plurality of memory cell strings interposed therebetween, wherein the forming of the memory cell array comprises forming the plurality of word line cut regions on one silicon single crystal of the polycrystalline silicon thin film so that at least two word line cut regions of the plurality of word line cut regions vertically overlap the one silicon single crystal and vertically overlap a grain boundary of the one silicon single crystal.

* * * * *